(12) United States Patent
Yoo et al.

(10) Patent No.: US 11,533,658 B2
(45) Date of Patent: Dec. 20, 2022

(54) COMPRESSED MEASUREMENT FEEDBACK USING AN ENCODER NEURAL NETWORK

(71) Applicant: QUALCOMM Incorporated, San Diego, CA (US)

(72) Inventors: Taesang Yoo, San Diego, CA (US); Naga Bhushan, San Diego, CA (US); Pavan Kumar Vitthaladevuni, San Diego, CA (US); June Namgoong, San Diego, CA (US); Krishna Kiran Mukkavilli, San Diego, CA (US); Tingfang Ji, San Diego, CA (US); Jay Kumar Sundararajan, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 113 days.

(21) Appl. No.: 17/180,124

(22) Filed: Feb. 19, 2021

(65) Prior Publication Data

US 2021/0266787 A1  Aug. 26, 2021

Related U.S. Application Data

(60) Provisional application No. 62/980,856, filed on Feb. 24, 2020.

(51) Int. Cl.
*G06N 3/04* (2006.01)
*G06N 3/08* (2006.01)
(Continued)

(52) U.S. Cl.
CPC .......... *H04W 28/06* (2013.01); *G06N 3/0427* (2013.01); *G06N 3/0454* (2013.01);
(Continued)

(58) Field of Classification Search
CPC ......... G06N 3/02–105; G06N 7/02–06; G06N 20/00–20; H03M 7/30–707;
(Continued)

(56) References Cited

U.S. PATENT DOCUMENTS 10,217,047 B2    2/2019   O'Shea
10,305,553 B2    5/2019   O'Shea et al.
(Continued)

FOREIGN PATENT DOCUMENTS

WO    WO-2020180221 A1 *  9/2020   .......... H04W 72/042

OTHER PUBLICATIONS

Yang Q., et al., "Deep Convolutional Compression for Massive MIMO CSI Feedback", Jul. 2, 2019, DOI: 10.1109/MLSP.2019.8918798, 8 Pages. (Year: 2019).*
(Continued)

*Primary Examiner* — Timothy J Weidner
(74) *Attorney, Agent, or Firm* — Holland & Hart LLP

(57) ABSTRACT

Methods, systems, and devices for wireless communications are described. A user equipment (UE) may perform a measurement operation to attain multiple measurements to report to a base station. The measurements may correspond to a first number of bits if reported. The UE may compress the measurements using an encoder neural network (NN) to obtain an encoder output indicating the measurements. This encoder output may include a second number of bits that is less than the first number of bits. The UE may report the encoder output to the base station in this compressed form. At the base station, the encoder output may be decompressed according to a decoder NN. Once the base station decompresses the encoder output, the UE and base station may communicate according to the measurements determined from the decompression. In some cases, the base station may perform load redistribution based on the measurements.

44 Claims, 17 Drawing Sheets

(51) Int. Cl.

| | | |
|---|---|---|
| *G06N 20/00* | (2019.01) | |
| *H04B 7/0417* | (2017.01) | |
| *H04B 7/0456* | (2017.01) | |
| *H04B 17/24* | (2015.01) | |
| *H04B 17/373* | (2015.01) | |
| *H04W 8/24* | (2009.01) | |
| *H04W 24/10* | (2009.01) | |
| *H04W 28/06* | (2009.01) | |
| *H04W 36/00* | (2009.01) | |
| *H04W 72/12* | (2009.01) | |
| *H04W 84/02* | (2009.01) | |
| *H04W 88/02* | (2009.01) | |
| *H04W 88/08* | (2009.01) | |
| *H04W 92/02* | (2009.01) | |
| *H04W 92/10* | (2009.01) | |

(52) U.S. Cl.
CPC ............... *G06N 3/08* (2013.01); *G06N 20/00* (2019.01); *H04B 7/0417* (2013.01); *H04B 7/0456* (2013.01); *H04B 17/24* (2015.01); *H04B 17/373* (2015.01); *H04W 8/24* (2013.01); *H04W 24/10* (2013.01); *H04W 36/0058* (2018.08); *H04W 72/1242* (2013.01); *H04W 84/02* (2013.01); *H04W 88/02* (2013.01); *H04W 88/08* (2013.01); *H04W 92/02* (2013.01); *H04W 92/10* (2013.01)

(58) Field of Classification Search
CPC .. H04B 7/02–12; H04B 17/0082–3913; H04L 1/0001–248; H04L 5/0001–0098; H04L 67/50–75; H04L 69/02–04; H04W 8/22–245; H04W 24/02–10; H04W 28/02–26; H04W 36/0005–385; H04W 48/02–20; H04W 72/005–14; H04W 74/002–008; H04W 84/02–16; H04W 88/02–12; H04W 92/02–04; H04W 92/10
See application file for complete search history.

(56) References Cited

U.S. PATENT DOCUMENTS

| | | | | |
|---|---|---|---|---|
| 2020/0220593 | A1* | 7/2020 | Wen | G06N 3/0454 |
| 2020/0366326 | A1* | 11/2020 | Jassal | G06N 3/0454 |
| 2020/0382929 | A1* | 12/2020 | Shi | G06N 3/0454 |
| 2021/0351885 | A1* | 11/2021 | Chavva | G06N 3/0454 |
| 2021/0385682 | A1* | 12/2021 | Bedekar | G06N 3/04 |

OTHER PUBLICATIONS

International Search Report and Written Opinion—PCT/US2021/019092—ISA/EPO—dated May 26, 2021.
KT Corp: "Views on Enhanced Inter UE TX Prioritization/Multiplexing", 3GPP Draft; R1-1907450, 3rd Generation Partnership Project (3GPP), Mobile Competence Centre; 650, Route Des Lucioles; F-06921 Sophia-Antipolis Cedex; France vol. RAN WG1, No. Reno, USA; May 13, 2019-May 17, 2019, May 13, 2019 (May 13, 2019), 3 Pages, XP051728881, Retrieved from the Internet: URL: http://www.3gpp.org/ftp/Meetings%5F3GPP%5FSYNC/RAN1/Docs/R1%2D1907450%2Ezip [retrieved on May 13, 2019] Section 2.3; p. 2.
Guo J., et al., "Convolutional Neural Network based Multiple-Rate Compressive Sensing for Massive MIMO CSI Feedback: Design, Simulation, and Analysis", Jun. 14, 2019, pp. 1-28.
Qing C., et al., "Deep Learning for CSI Feedback Based on Superimposed Coding", DOI: 10.1109/ACCESS.2019.2 928049, Jul. 2019, pp. 1-11.
U.S. Appl. No. 62/980,856, filed Feb. 24, 2020, 97 Pages.
Yang Q., et al., "Deep Convolutional Compression for Massive MIMO CSI Feedback", Jul. 2, 2019, DOI: 10.1109/MLSP.2019.8918798, 8 Pages.

* cited by examiner

COMPRESSED MEASUREMENT FEEDBACK USING AN ENCODER NEURAL NETWORK

CROSS REFERENCE

The present application for patent claims the benefit of U.S. Provisional Patent Application No. 62/980,856 by YOO et al., entitled "COMPRESSED MEASUREMENT FEEDBACK USING AN ENCODER NEURAL NETWORK," filed Feb. 24, 2020, assigned to the assignee hereof, and expressly incorporated by reference herein.

INTRODUCTION

The following relates to wireless communications and more specifically to measurement feedback by a user equipment (UE).

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform spread orthogonal frequency division multiplexing (DFT-S-OFDM). A wireless multiple-access communications system may include one or more base stations or one or more network access nodes, each simultaneously supporting communication for multiple communication devices, which may be otherwise known as UEs.

SUMMARY

A method for wireless communications at a UE is described. The method may include performing measurement operations to obtain a plurality of measurements corresponding to a first number of bits for reporting the plurality of measurements and compressing the plurality of measurements using an encoder neural network (NN) to obtain an encoder output indicating the plurality of measurements, the encoder output including a second number of bits that is less than the first number of bits for reporting the plurality of measurements. The method may further include transmitting, to a base station, a set of neural network decoder coefficients for decoding the encoder output and transmitting the encoder output.

An apparatus for wireless communications at a UE is described. The apparatus may include a processor and memory coupled to the processor. The processor and memory may be configured to perform measurement operations to obtain a set of measurements corresponding to a first number of bits for reporting the set of measurements and compress the set of measurements using an encoder NN to obtain an encoder output indicating the set of measurements, the encoder output including a second number of bits that is less than the first number of bits for reporting the set of measurements. The processor and memory may be further configured to transmit, to a base station, the encoder output.

Another apparatus for wireless communications at a UE is described. The apparatus may include means for performing measurement operations to obtain a set of measurements corresponding to a first number of bits for reporting the set of measurements and means for compressing the set of measurements using an encoder NN to obtain an encoder output indicating the set of measurements, the encoder output including a second number of bits that is less than the first number of bits for reporting the set of measurements. The apparatus may further include means for transmitting, to a base station, the encoder output.

A non-transitory computer-readable medium storing code for wireless communications at a UE is described. The code may include instructions executable by a processor to perform measurement operations to obtain a set of measurements corresponding to a first number of bits for reporting the set of measurements and compress the set of measurements using an encoder NN to obtain an encoder output indicating the set of measurements, the encoder output including a second number of bits that is less than the first number of bits for reporting the set of measurements. The code may further include instructions executable by the processor to transmit, to a base station, the encoder output.

Some examples of the method, apparatuses, and non-transitory computer-readable medium described herein may further include operations, features, means, or instructions for transmitting, to the base station, a message indicating that the UE has the capability of compressing the set of measurements using the encoder NN.

Some examples of the method, apparatuses, and non-transitory computer-readable medium described herein may further include operations, features, means, or instructions for performing a radio resource control setup procedure including the transmission of the message.

Some examples of the method, apparatuses, and non-transitory computer-readable medium described herein may further include operations, features, means, or instructions for receiving, from the base station, a configuration message configuring the UE to operate in a compression enabled mode, where the compressing the set of measurements using the encoder NN may be based on the UE operating in the compression enabled mode.

Some examples of the method, apparatuses, and non-transitory computer-readable medium described herein may further include operations, features, means, or instructions for receiving, from the base station, an indication of the set of measurements, where the compressing the set of measurements using the encoder NN further includes operations, features, means, or instructions for inputting the set of measurements into the encoder NN based on the indication of the set of measurements.

Some examples of the method, apparatuses, and non-transitory computer-readable medium described herein may further include operations, features, means, or instructions for receiving, from the base station, an uplink grant for the encoder output, where the encoder output may be transmitted based on the uplink grant.

In some examples of the method, apparatuses, and non-transitory computer-readable medium described herein, the uplink grant semi-statically grants a periodic resource for a periodic transmission of the encoder output.

In some examples of the method, apparatuses, and non-transitory computer-readable medium described herein, the uplink grant dynamically grants a resource for a transmission of the encoder output.

Some examples of the method, apparatuses, and non-transitory computer-readable medium described herein may further include operations, features, means, or instructions for transmitting, to the base station, a set of NN decoder coefficients for decoding the encoder output.

Some examples of the method, apparatuses, and non-transitory computer-readable medium described herein may further include operations, features, means, or instructions for receiving, from the base station, a configuration message indicating a periodicity for NN decoder coefficient feedback, where the NN decoder coefficients may be periodically transmitted to the base station based on the periodicity for NN decoder coefficient feedback.

Some examples of the method, apparatuses, and non-transitory computer-readable medium described herein may further include operations, features, means, or instructions for receiving, from the base station, a configuration message indicating a priority rule for the transmitting the encoder output and determining to transmit the encoder output on a resource based on the priority rule.

In some examples of the method, apparatuses, and non-transitory computer-readable medium described herein, the resource may be an updated resource. Some examples of the method, apparatuses, and non-transitory computer-readable medium described herein may further include operations, features, means, or instructions for determining to transmit the encoder output on an initial resource, determining that a message scheduled for communication at least partially overlaps with the initial resource, and preempting transmission of the encoder output based on the message having a higher priority than the encoder output according to the priority rule, where the encoder output may be transmitted on the updated resource based on the preempting.

Some examples of the method, apparatuses, and non-transitory computer-readable medium described herein may further include operations, features, means, or instructions for determining that a message scheduled for communication at least partially overlaps with the resource and preempting communication of the message based on the message having a lower priority than the encoder output according to the priority rule, where the encoder output may be transmitted on the resource based on the preempting.

In some examples of the method, apparatuses, and non-transitory computer-readable medium described herein, the base station may be a first base station and the method, apparatuses, and non-transitory computer-readable medium described herein may further include operations, features, means, or instructions for performing a handover procedure from the first base station to a second base station different from the first base station based on the transmitting the encoder output.

Some examples of the method, apparatuses, and non-transitory computer-readable medium described herein may further include operations, features, means, or instructions for training the encoder NN at the UE based on historical measurements at the UE or a UE performance metric or both.

Some examples of the method, apparatuses, and non-transitory computer-readable medium described herein may further include operations, features, means, or instructions for training a decoder NN at the UE based on the training the encoder NN at the UE, and transmitting, to the base station, an indication of the trained decoder NN.

In some examples of the method, apparatuses, and non-transitory computer-readable medium described herein, the UE includes an auto-encoder including the encoder NN and the decoder NN.

In some examples of the method, apparatuses, and non-transitory computer-readable medium described herein, the encoder output includes a feature indicating at least two measurements of the set of measurements or a statistic associated with the set of measurements or both.

In some examples of the method, apparatuses, and non-transitory computer-readable medium described herein, the set of measurements corresponds to a set of base stations, a set of sensors at the UE, a set of radio access technologies (RATs), or a combination thereof.

In some examples of the method, apparatuses, and non-transitory computer-readable medium described herein, the set of measurements includes a reference signal received power (RSRP) measurement, a reference signal received quality (RSRQ) measurement, a received signal strength indicator (RSSI), a reference signal time difference (RSTD), a global navigation satellite system (GNSS) measurement, a round-trip time (RTT) measurement, a sensor output, or a combination thereof.

A method for wireless communications at a base station is described. The method may include receiving, from a UE, a set of neural network decoder coefficients. The method may further include determining a decoder neural network (NN) based at least in part on the received set of neural network decoder coefficients. In addition, the method may include receiving an encoder output including a first number of bits and decompressing the encoder output using the decoder NN to obtain a plurality of measurements, the plurality of measurements corresponding to a second number of bits for reporting the plurality of measurements that is greater than the first number of bits. The method may further include communicating with the UE based on the plurality of measurements.

An apparatus for wireless communications at a base station is described. The apparatus may include a processor and memory coupled to the processor. The processor and memory may be configured to receive, from a UE, an encoder output including a first number of bits and decompress the encoder output using a decoder NN to obtain a set of measurements, the set of measurements corresponding to a second number of bits for reporting the set of measurements that is greater than the first number of bits. The processor and memory may be further configured to communicate with the UE based on the set of measurements.

Another apparatus for wireless communications at a base station is described. The apparatus may include means for receiving, from a UE, an encoder output including a first number of bits and means for decompressing the encoder output using a decoder NN to obtain a set of measurements, the set of measurements corresponding to a second number of bits for reporting the set of measurements that is greater than the first number of bits. The apparatus may further include means for communicating with the UE based on the set of measurements.

A non-transitory computer-readable medium storing code for wireless communications at a base station is described. The code may include instructions executable by a processor to receive, from a UE, an encoder output including a first number of bits and decompress the encoder output using a decoder NN to obtain a set of measurements, the set of measurements corresponding to a second number of bits for reporting the set of measurements that is greater than the first number of bits. The code may include instructions further executable by the processor to communicate with the UE based on the set of measurements.

Some examples of the method, apparatuses, and non-transitory computer-readable medium described herein may further include operations, features, means, or instructions for receiving, from the UE, a message indicating that the UE has the capability of compressing the set of measurements using an encoder NN, where the decompressing the encoder output using the decoder NN may be based on the message.

Some examples of the method, apparatuses, and non-transitory computer-readable medium described herein may further include operations, features, means, or instructions for performing a radio resource control setup procedure with the UE including the reception of the message.

Some examples of the method, apparatuses, and non-transitory computer-readable medium described herein may further include operations, features, means, or instructions for transmitting, to the UE, a configuration message configuring the UE to operate in a compression enabled mode, where the encoder output may be received based on the UE operating in the compression enabled mode.

Some examples of the method, apparatuses, and non-transitory computer-readable medium described herein may further include operations, features, means, or instructions for transmitting, to the UE, an indication of the set of measurements for compression, where the encoder output indicates the set of measurements based on the indication of the set of measurements for compression.

Some examples of the method, apparatuses, and non-transitory computer-readable medium described herein may further include operations, features, means, or instructions for transmitting, to the UE, an uplink grant for the encoder output, where the encoder output may be received based on the uplink grant.

In some examples of the method, apparatuses, and non-transitory computer-readable medium described herein, the uplink grant semi-statically grants a periodic resource for a periodic transmission of the encoder output.

In some examples of the method, apparatuses, and non-transitory computer-readable medium described herein, the uplink grant dynamically grants a resource for a transmission of the encoder output.

Some examples of the method, apparatuses, and non-transitory computer-readable medium described herein may further include operations, features, means, or instructions for receiving, from the UE, a set of NN decoder coefficients and determining the decoder NN based on the received NN decoder coefficients.

Some examples of the method, apparatuses, and non-transitory computer-readable medium described herein may further include operations, features, means, or instructions for transmitting, to the UE, a configuration message indicating a periodicity for NN decoder coefficient feedback, where the NN decoder coefficients may be periodically received from the UE based on the periodicity for NN decoder coefficient feedback.

Some examples of the method, apparatuses, and non-transitory computer-readable medium described herein may further include operations, features, means, or instructions for transmitting, to the UE, a configuration message indicating a priority rule for transmission of the encoder output, where the encoder output may be received on a resource based on the priority rule.

In some examples of the method, apparatuses, and non-transitory computer-readable medium described herein, the base station may be a first base station and the method, apparatuses, and non-transitory computer-readable medium described herein may further include operations, features, means, or instructions for initiating a handover of the UE to a second base station different from the first base station based on the set of measurements.

In some examples of the method, apparatuses, and non-transitory computer-readable medium described herein, the communicating may include operations, features, means, or instructions for performing a load redistribution across a set of base stations or a set of RATs or both for a set of UEs including the UE based on the set of measurements.

In some examples of the method, apparatuses, and non-transitory computer-readable medium described herein, the encoder output includes a feature indicating at least two measurements of the set of measurements or a statistic associated with the set of measurements or both.

In some examples of the method, apparatuses, and non-transitory computer-readable medium described herein, the set of measurements corresponds to a set of base stations, a set of sensors at the UE, a set of RATs, or a combination thereof.

In some examples of the method, apparatuses, and non-transitory computer-readable medium described herein, the set of measurements includes an RSRP measurement, an RSRQ measurement, an RSSI, an RSTD, a GNSS measurement, an RTT measurement, a sensor output, or a combination thereof.

DETAILED DESCRIPTION

Figure 1:
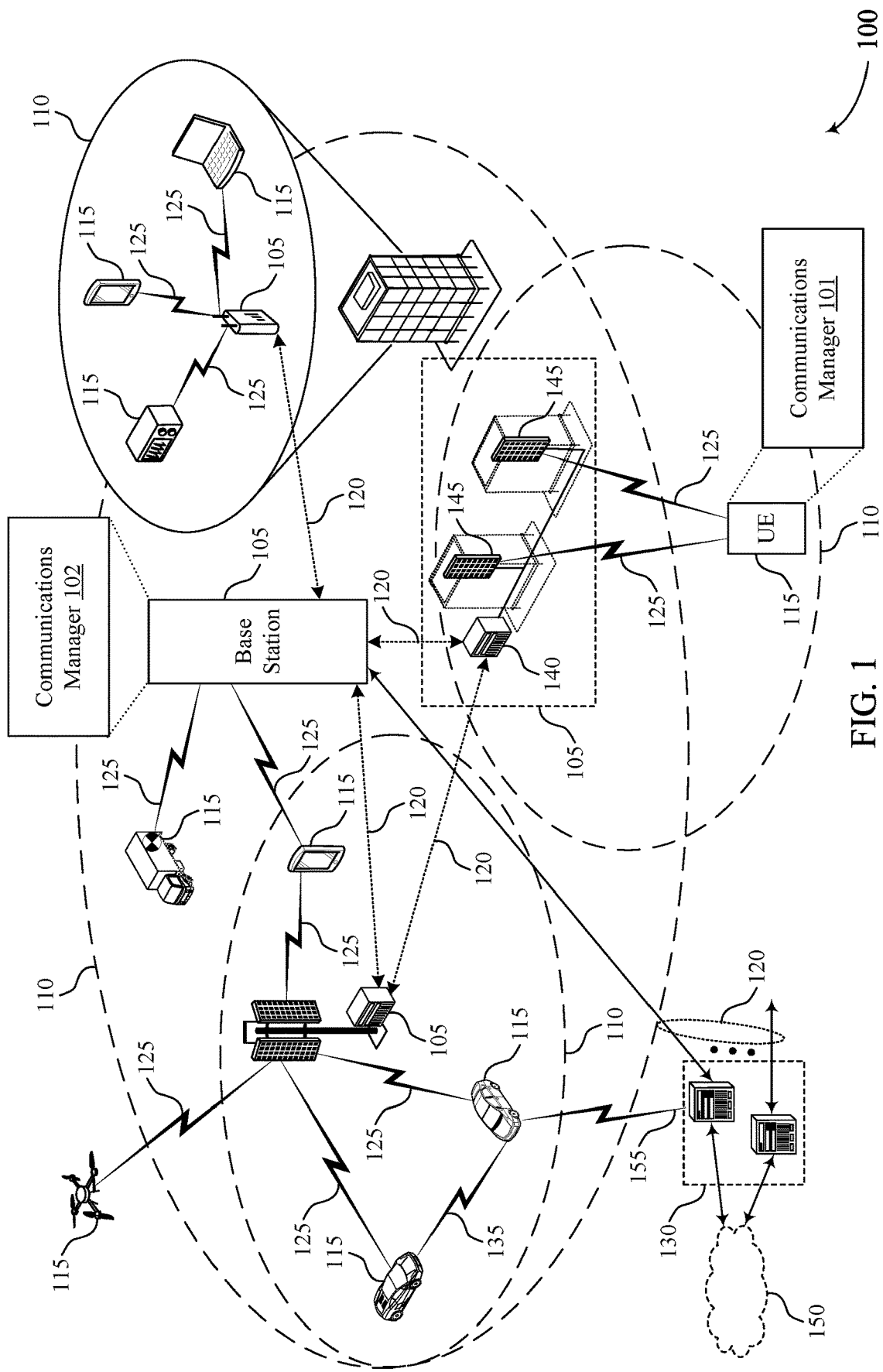
FIGS. 1 and 2 illustrate examples of wireless communications systems that support compressed measurement feedback using an encoder NN, in accordance with one or more aspects of the present disclosure.

In some wireless communication systems, a UE may perform a measurement operation to determine and report a number of measurements (e.g., measurements related to signaling, sensors, etc.). The measurements may correspond to one or more base stations, one or more sensors at the UE, one or more RATs, or a combination thereof. The measurements may include information related to a reference signal (RS), a position of the UE, a sensor output, or a combination thereof. In some cases, particular measurements may be correlated, and the UE may report the raw measurements to a base station. However, to efficiently handle the correlations between measurements, techniques may be used to compress measurement feedback at the UE, so the base station may decode (e.g., by decompressing) the compressed output to obtain the measurements. Reporting the compressed measurements to the base station, as opposed to the raw measurements (e.g., with separate bit representations for each measurement in separate fields), may improve signaling overhead associated with the measurement reporting and support efficient resource allocation at the UE.

Accordingly, the techniques described herein may enable a UE to encode input measurements and transmit the compressed encoder outputs to a base station. The compressed encoder outputs may be decoded and utilized by the base station to improve signaling overhead and the system efficiency. In some cases, the UE may perform a measurement operation to attain a number of measurements. The measurements may correspond to a number of bits for reporting if the raw measurements are reported (e.g., in separate fields) to the base station. The UE may compress the measurements using an encoder NN to obtain an encoder output indicating the measurements. In some cases, the encoder output may include a number of bits that is less than the number of bits for reporting the raw measurements (e.g., reporting each measurement in a separate field). The UE may report the encoder output to the base station in a compressed form, thus improving signaling overhead (e.g., by using fewer bits to report the measurements to the base station).

At the base station, the encoder output may be decompressed according to a decoder NN. The number of bits of the decompressed output (e.g., corresponding to the raw measurements) may be larger than the number of bits of the encoder output. The base station may determine the measurements made by the UE by decompressing the encoder output, and the UE and the base station may communicate according to the determined measurements. That is, the base station may allocate resources (e.g., perform a handover procedure, perform load redistribution across one or more base stations or RATs, or perform any other optimization operation) according to the measurement feedback from the UE, thus improving the system efficiency.

Additionally or alternatively, the base station may configure the UE to encode measurements according to the NN. For example, the UE may report a capability to the base station, and the base station may indicate—for example, in a configuration message—for the UE to operate in a compression enabled mode based on the capability. In some examples, the base station may transmit an uplink grant for the encoder output, an indication of the measurements for compression, a priority rule for transmission of the encoder output, or a combination thereof. The UE may transmit the encoded measurements based on the signaling from the base station, which may reduce overall signaling overhead on the channel (e.g., associated with the UE measurement reporting).

Aspects of the disclosure are initially described in the context of wireless communications systems. Additional aspects are described with reference to a compression/decompression procedure and a process flow. Aspects of the disclosure are further illustrated by and described with reference to apparatus diagrams, system diagrams, and flowcharts that relate to compressed measurement feedback using an encoder NN.

FIG. 1 illustrates an example of a wireless communications system 100 that supports compressed measurement feedback using an encoder NN, in accordance with one or more aspects of the present disclosure. The wireless communications system 100 may include one or more base stations 105, one or more UEs 115, and a core network 130. In some examples, the wireless communications system 100 may be an LTE network, an LTE-A network, an LTE-A Pro network, or an NR network. In some examples, the wireless communications system 100 may support enhanced broadband communications, ultra-reliable (e.g., mission critical) communications, low latency communications, communications with low-cost and low-complexity devices, or any combination thereof.

The base stations 105 may be dispersed throughout a geographic area to form the wireless communications system 100 and may be devices in different forms or having different capabilities. The base stations 105 and the UEs 115 may wirelessly communicate via one or more communication links 125. Each base station 105 may provide a coverage area 110 over which the UEs 115 and the base station 105 may establish one or more communication links 125. The coverage area 110 may be an example of a geographic area over which a base station 105 and a UE 115 may support the communication of signals according to one or more radio access technologies.

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be able to communicate with various types of devices, such as other UEs 115, the base stations 105, or network equipment (e.g., core network nodes, relay devices, integrated access and backhaul (IAB) nodes, or other network equipment), as shown in FIG. 1.

The base stations 105 may communicate with the core network 130, or with one another, or both. For example, the base stations 105 may interface with the core network 130 through one or more backhaul links 120 (e.g., via an S1, N2, N3, or other interface). The base stations 105 may communicate with one another over the backhaul links 120 (e.g., via an X2, Xn, or other interface) either directly (e.g., directly between base stations 105), or indirectly (e.g., via core network 130), or both. In some examples, the backhaul links 120 may be or include one or more wireless links.

One or more of the base stations 105 described herein may include or may be referred to by a person having ordinary skill in the art as a base transceiver station, a radio base station, an access point, a radio transceiver, a NodeB, an eNodeB (eNB), a next-generation NodeB or a giga-NodeB (either of which may be referred to as a gNB), a Home NodeB, a Home eNodeB, or other suitable terminology.

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the base stations 105 and the network equipment including macro eNBs or gNBs, small cell eNBs or gNBs, or relay base stations, among other examples, as shown in FIG. 1.

The UEs 115 and the base stations 105 may wirelessly communicate with one another via one or more communication links 125 over one or more carriers. The term "carrier" may refer to a set of radio frequency spectrum resources having a defined physical layer structure for supporting the communication links 125. For example, a carrier used for a communication link 125 may include a portion of a radio frequency spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers.

Signal waveforms transmitted over a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme, the coding rate of the modulation scheme, or both). Thus, the more resource elements that a UE 115 receives and the higher the order of the modulation scheme, the higher the data rate may be for the UE 115. A wireless communications resource may refer to a combination of a radio frequency spectrum resource, a time resource, and a spatial resource (e.g., spatial layers or beams), and the use of multiple spatial layers may further increase the data rate or data integrity for communications with a UE 115.

The time intervals for the base stations 105 or the UEs 115 may be expressed in multiples of a basic time unit which may, for example, refer to a sampling period of $T_s=1/(\Delta f_{max} \cdot N_f)$ seconds, where $\Delta f_{max}$ may represent the maximum supported subcarrier spacing, and $N_f$ may represent the maximum supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively numbered subframes or slots, and each subframe or slot may have the same duration. In some examples, a frame may be divided (e.g., in the time domain) into subframes, and each subframe may be further divided into a number of slots. Alternatively, each frame may include a variable number of slots, and the number of slots may depend on subcarrier spacing. Each slot may include a number of symbol periods (e.g., depending on the length of the cyclic prefix prepended to each symbol period). In some wireless communications systems 100, a slot may further be divided into multiple mini-slots containing one or more symbols. Excluding the cyclic prefix, each symbol period may contain one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., the number of symbol periods in a TTI) may be variable. Additionally or alternatively, the smallest scheduling unit of the wireless communications system 100 may be dynamically selected (e.g., in bursts of shortened TTIs (sTTIs)).

Physical channels may be multiplexed on a carrier according to various techniques. A physical control channel and a physical data channel may be multiplexed on a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a number of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to a number of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

Each base station 105 may provide communication coverage via one or more cells, for example a macro cell, a small cell, a hot spot, or other types of cells, or any combination thereof. The term "cell" may refer to a logical communication entity used for communication with a base station 105 (e.g., over a carrier) and may be associated with an identifier for distinguishing neighboring cells (e.g., a physical cell identifier (PCID), a virtual cell identifier (VCID), or others). In some examples, a cell may also refer to a geographic coverage area 110 or a portion of a geographic coverage area 110 (e.g., a sector) over which the logical communication entity operates. Such cells may range from smaller areas (e.g., a structure, a subset of structure) to larger areas depending on various factors such as the capabilities of the base station 105. For example, a cell may be or include a building, a subset of a building, or exterior spaces between or overlapping with geographic coverage areas 110, among other examples.

A macro cell may cover a relatively large geographic area (e.g., several kilometers in radius) and may allow unrestricted access by the UEs 115 with service subscriptions with the network provider supporting the macro cell. A small cell may be associated with a lower-powered base station 105, as compared with a macro cell, and a small cell may operate in the same or different (e.g., licensed, unlicensed) frequency bands as macro cells. Small cells may provide unrestricted access to the UEs 115 with service subscriptions with the network provider or may provide restricted access to the UEs 115 having an association with the small cell (e.g., the UEs 115 in a closed subscriber group (CSG), the UEs 115 associated with users in a home or office). A base station 105 may support one or multiple cells and may also support communications over the one or more cells using one or multiple component carriers.

In some examples, a carrier may support multiple cells, and different cells may be configured according to different protocol types (e.g., MTC, narrowband IoT (NB-IoT), enhanced mobile broadband (eMBB)) that may provide access for different types of devices.

In some examples, a base station 105 may be movable and therefore provide communication coverage for a moving geographic coverage area 110. In some examples, different geographic coverage areas 110 associated with different technologies may overlap, but the different geographic coverage areas 110 may be supported by the same base station 105. In other examples, the overlapping geographic coverage areas 110 associated with different technologies may be supported by different base stations 105. The wireless communications system 100 may include, for example, a heterogeneous network in which different types of the base stations 105 provide coverage for various geographic coverage areas 110 using the same or different radio access technologies.

Some UEs 115, such as MTC or IoT devices, may be low cost or low complexity devices and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay such information to a central server or application program that makes use of the information or presents the information to humans interacting with the application program. Some UEs 115 may be designed to collect information or enable automated behavior of machines or other devices. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

The wireless communications system 100 may be configured to support ultra-reliable communications or low-latency communications, or various combinations thereof. For example, the wireless communications system 100 may be configured to support ultra-reliable low-latency communications (URLLC) or mission critical communications. The UEs 115 may be designed to support ultra-reliable, low-latency, or critical functions (e.g., mission critical functions). Ultra-reliable communications may include private communication or group communication and may be supported by one or more mission critical services such as mission critical push-to-talk (MCPTT), mission critical video (MCVideo), or mission critical data (MCData). Support for mission critical functions may include prioritization of services, and mission critical services may be used for public safety or general commercial applications. The terms ultra-reliable, low-latency, mission critical, and ultra-reliable low-latency may be used interchangeably herein.

In some examples, a UE 115 may also be able to communicate directly with other UEs 115 over a device-to-device (D2D) communication link 135 (e.g., using a peer-to-peer (P2P) or D2D protocol). One or more UEs 115 utilizing D2D communications may be within the geographic coverage area 110 of a base station 105. Other UEs 115 in such a group may be outside the geographic coverage area 110 of a base station 105 or be otherwise unable to receive transmissions from a base station 105. In some examples, groups of the UEs 115 communicating via D2D communications may utilize a one-to-many (1:M) system in which each UE 115 transmits to every other UE 115 in the group. In some examples, a base station 105 facilitates the scheduling of resources for D2D communications. In other cases, D2D communications are carried out between the UEs 115 without the involvement of a base station 105.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the base stations 105 associated with the core network 130. User IP packets may be transferred through the user plane entity, which may provide IP address allocation as well as other functions. The user plane entity may be connected to the network operators IP services 150. The operators IP services 150 may include access to the Internet, Intranet(s), an IP Multimedia Subsystem (IMS), or a Packet-Switched Streaming Service.

Some of the network devices, such as a base station 105, may include subcomponents such as an access network entity 140, which may be an example of an access node controller (ANC). Each access network entity 140 may communicate with the UEs 115 through one or more other access network transmission entities 145, which may be referred to as radio heads, smart radio heads, or transmission/reception points (TRPs). Each access network transmission entity 145 may include one or more antenna panels. In some configurations, various functions of each access network entity 140 or base station 105 may be distributed across various network devices (e.g., radio heads and ANCs) or consolidated into a single network device (e.g., a base station 105).

The wireless communications system 100 may operate using one or more frequency bands, which may be in the range of 300 megahertz (MHz) to 300 gigahertz (GHz). In some cases, the region from 300 MHz to 3 GHz is known as the ultra-high frequency (UHF) region or decimeter band because the wavelengths range from approximately one decimeter to one meter in length. The UHF waves may be blocked or redirected by buildings and environmental features, but the waves may penetrate structures sufficiently for a macro cell to provide service to the UEs 115 located indoors. The transmission of UHF waves may be associated with smaller antennas and shorter ranges (e.g., less than 100 kilometers) compared to transmission using the smaller frequencies and longer waves of the high frequency (HF) or very high frequency (VHF) portion of the spectrum below 300 MHz.

The electromagnetic spectrum is often subdivided, based on frequency/wavelength, into various classes, bands, channels, etc. In 5G NR two initial operating bands have been identified as frequency range designations FR1 (410 MHz-7.125 GHz) and FR2 (24.25 GHz-52.6 GHz). The frequencies between FR1 and FR2 are often referred to as mid-band frequencies. Although a portion of FR1 is greater than 6 GHz, FR1 is often referred to (interchangeably) as a "Sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

With the above aspects in mind, unless specifically stated otherwise, it should be understood that the term "sub-6 GHz" or the like if used herein may broadly represent frequencies that may be less than 6 GHz, may be within FR1, or may include mid-band frequencies. Further, unless specifically stated otherwise, it should be understood that the term "millimeter wave" or the like if used herein may broadly represent frequencies that may include mid-band frequencies, may be within FR2, or may be within the EHF band.

The wireless communications system 100 may utilize both licensed and unlicensed radio frequency spectrum bands. For example, the wireless communications system 100 may employ License Assisted Access (LAA), LTE-Unlicensed (LTE-U) radio access technology, or NR technology in an unlicensed band such as the 5 GHz industrial, scientific, and medical (ISM) band. When operating in unlicensed radio frequency spectrum bands, devices such as the base stations 105 and the UEs 115 may employ carrier sensing for collision detection and avoidance. In some examples, operations in unlicensed bands may be based on a carrier aggregation configuration in conjunction with component carriers operating in a licensed band (e.g., LAA). Operations in unlicensed spectrum may include downlink transmissions, uplink transmissions, P2P transmissions, or D2D transmissions, among other examples.

A base station 105 or a UE 115 may be equipped with multiple antennas, which may be used to employ techniques such as transmit diversity, receive diversity, multiple-input multiple-output (MIMO) communications, or beamforming. The antennas of a base station 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations. Additionally or alternatively, an antenna panel may support radio frequency beamforming for a signal transmitted via an antenna port.

The base stations 105 or the UEs 115 may use MIMO communications to exploit multipath signal propagation and increase the spectral efficiency by transmitting or receiving multiple signals via different spatial layers. Such techniques may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream and may carry bits associated with the same data stream (e.g., the same codeword) or different data streams (e.g., different codewords). Different spatial layers may be associated with different antenna ports used for channel measurement and reporting. MIMO techniques include single-user MIMO (SU-MIMO), where multiple spatial layers are transmitted to the same receiving device, and multiple-user MIMO (MU-MIMO), where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating at particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In some cases, a UE 115 in the wireless communications system 100 may encode input measurements to obtain an encoder output and may transmit the compressed encoder output using a communications manager 101. The compression operation may reduce the signaling overhead associated with the UE measurement feedback. A base station 105 in the wireless communications system 100 may receive the compressed encoder output and may decode the encoder output to determine the UE measurements, for example, using a communications manager 102. The base station 105 may utilize the determined measurements to improve inefficiencies in the system.

For example, the UE 115 may perform a measurement operation to attain a number of measurements. The measurements may correspond to a number of bits for reporting the measurements (e.g., in separate fields) to the base station 105. The UE 115 may compress the measurements using an encoder NN to obtain an encoder output indicating the measurements. In some cases, the encoder output may include a number of bits that is less than the number of bits for reporting the raw measurements. The UE 115 may report the encoder output to the base station in a compressed form, thus reducing signaling overhead. At the base station 105, the encoder output may be decompressed according to a decoder NN. In some cases, the UE 115 may signal information related to the decoder NN to the base station 105, and the base station 105 may determine the decoder NN (e.g., determine decoder weights) based on the information received from the UE 115. The base station 105 may use the decompressed encoder output—corresponding to the measurements attained at the UE 115—to communicate with the UE 115. That is, the base station 105 may allocate resources (e.g., perform a handover procedure, perform load redistribution across one or more base stations 105, perform load redistribution across one or more RATs, or perform some combination of these or similar communication operations) according to the measurement feedback from the UE 115, thus improving efficiency in the system.

Figure 2:
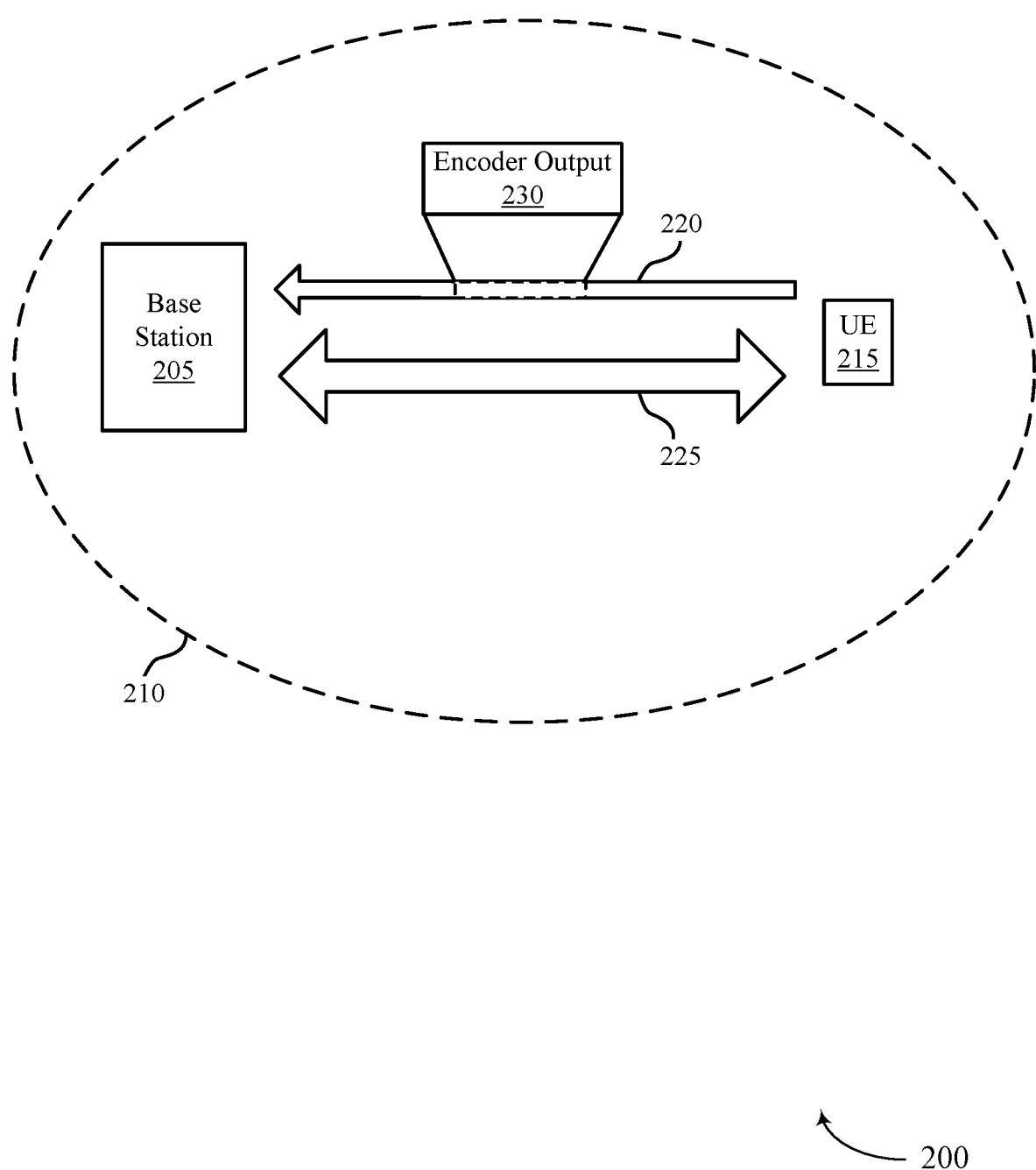

FIG. 2 illustrates an example of a wireless communications system 200 that supports compressed measurement feedback using an encoder NN, in accordance with one or more aspects of the present disclosure. In some examples, wireless communications system 200 may implement aspects of wireless communications system 100 and may include UE 215, base station 205 with coverage area 210, and communication link 225, which may be examples of a UE 115, base station 105, coverage area 110, and communication link 125 described with reference to FIG. 1. For example, UE 215 and base station 205 may transmit and receive control information, data, or both via communication link 225 according to measurement feedback from UE 215. UE 215 may feedback the measurement information using encoder output 230, compressing the information to reduce the signaling overhead associated with the measurement feedback.

In some cases, UE 215 may perform a measurement operation to determine multiple measurements (e.g., measurements related to signaling between UE 215 and base station 205, measurements related to signaling between UE 215 and another base station, measurements related to sensor readings at UE 215, or any combination of these or other measurements). UE 215 may report the measurements to base station 205. For example, UE 215 may be configured by base station 205 to periodically, or aperiodically (e.g., according to a trigger from base station 205, a trigger at UE 215, an aperiodic schedule, etc.), report the measurements to base station 205. In some examples, the measurements may be radio resource control (RRC) measurements. In some cases, the measurements may relate to an RSRP, an RSRQ, an RSSI, a message or value corresponding to signal strength or a channel state information reference signal (CSI-RS), or some combination thereof. Additionally or alternatively, UE 215 may perform a measurement operation on RSs from one or more base stations. For example, UE 215 may be in a coverage area 210 for one or more base stations in addition to base station 205 shown in FIG. 2. As such, UE 215 may receive one or more RSs from multiple base stations. In some cases, UE 215 may perform measurement operations on the one or more RSs. Additionally or alternatively, UE 215 may perform measurement operations for one or more RATs (e.g., LTE, Wi-Fi, NR, etc.).

In some examples, UE 215 may report measurements related to the positioning of UE 215. For example, UE 215 may report a GNSS related measurement (e.g., timing, code, phase, etc.) an RSTD, an RTT related measurement, or a combination thereof. Additionally or alternatively, UE 215 may report measurements related to sensor outputs (e.g., associated with positioning of UE 215). For example, UE 215 may report a barometric pressure (e.g., corresponding to an elevation), a velocity, an acceleration, an orientation of UE 215, or any combination of these sensor outputs. In some cases, UE 215 may report camera outputs or similar measurements related to positioning, tracking, or both of UE 215. In some examples, some of these measurements may be correlated. For example, the UE's positioning and the UE's RSRP measurements from multiple base stations may be correlated (e.g., as, in some cases, UE 215 may measure a relatively stronger RSRP from a base station that is closer to the UE's position than from another base station that is farther from the UE's position). Reporting raw measurements to base station 205 (e.g., using a separate set of bits to indicate each measurement individually) may cause a high signaling volume and inefficient resource allocation at UE 215.

In some cases, UE 215 may report a compressed version of the measurements (e.g., encoder output 230) to base station 205 via signaling 220. In some examples, UE 215 may transmit the encoder output 230 over the communication link 225 (e.g., on an uplink control channel, an uplink data channel, or some other uplink channel). Base station 205 may extract features, statistics, or both related to the compressed measurements and use the information to improve resource allocation. For example, UE 215 may combine data and perform data compression of the measurements using an auto-encoder. An auto-encoder may be an example of an NN that performs machine learning to determine efficient data encodings (e.g., using unsupervised model training). The auto-encoder may include an encoder, code, and a decoder, in which the auto-encoder trains an encoder NN for compressing data for efficient transmission and a decoder NN for decompressing data for accurate determination of the compressed data. In some examples, the auto-encoder may implement machine learning techniques including an NN for data compression. That is, UE 215 may train the encoder according to one or more machine learning algorithms in an NN. Similarly, UE 215 may train a decoder according to one or more machine learning algorithms in an NN based on the encoder training, such that the decoder may receive the encoder's output and successfully decompress the encoder's output. UE 215 may send coefficients, or parameters, to base station 205 corresponding to the trained encoder, the trained decoder, or both, such that base station 205 may implement a decoder that uses the indicated coefficients to accurately decompress encoded data.

Specifically, based on the machine learned models, UE 215 may compress measurements at an encoder according to parameters corresponding to the trained encoder NN and may send the encoder output 230 to base station 205. Base station 205 may decode the encoder output 230 using a decoder according to the coefficients corresponding to the trained decoder NN in order to determine the measurements or statistics associated with the measurements.

Figure 3:
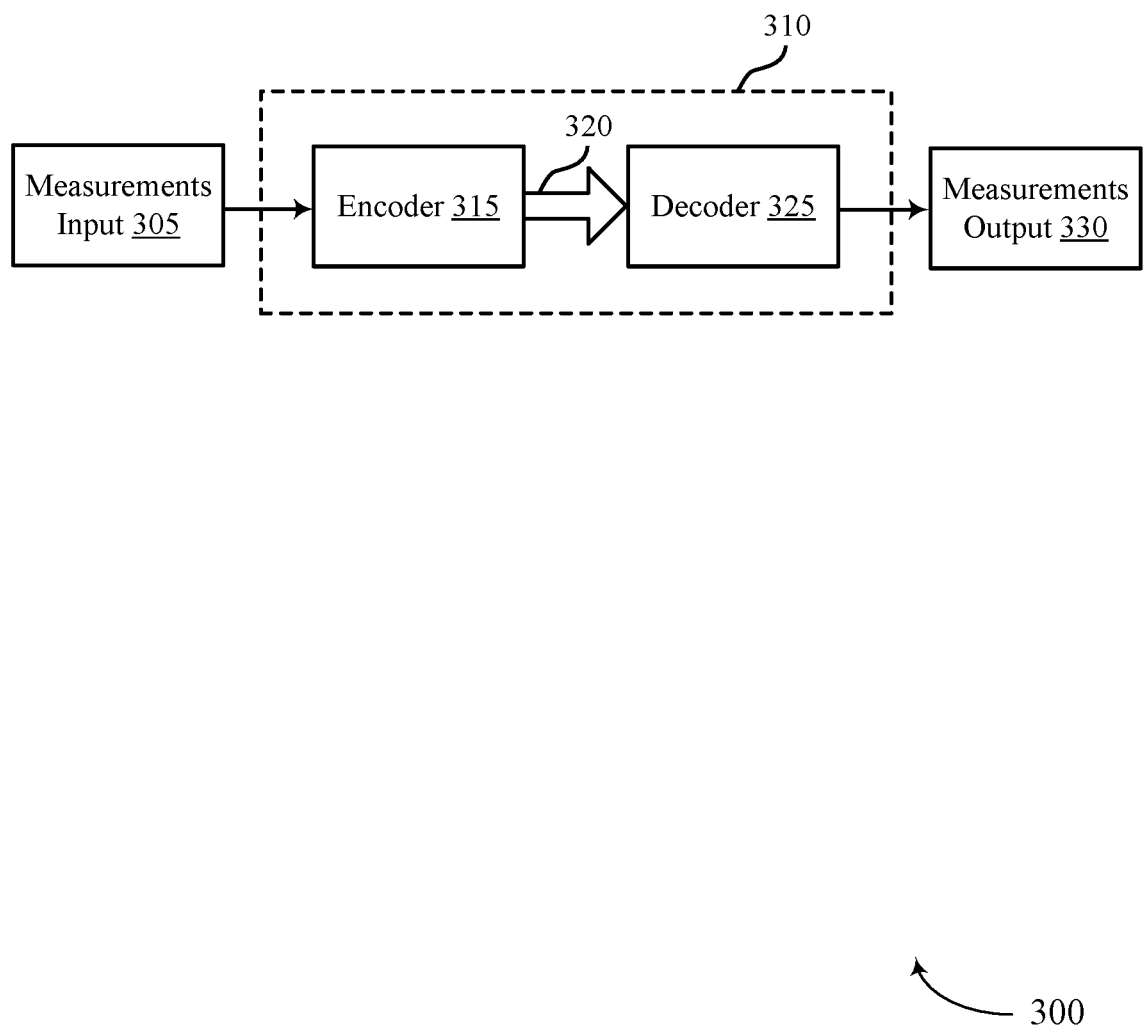
FIG. 3 illustrates an example of a compression/decompression procedure that supports compressed measurement feedback using an encoder NN, in accordance with one or more aspects of the present disclosure.

FIG. 3 illustrates an example of a compression/decompression procedure 300 that supports compressed measurement feedback using an encoder NN, in accordance with one or more aspects of the present disclosure. In some examples, the compression/decompression procedure 300 may implement aspects of wireless communications systems 100 and 200. For example, a UE 115 or 215 and a base station 105 or 205, as described with reference to FIGS. 1 and 2, may implement an auto-encoder system to reduce signaling overhead related to measurement feedback. Additionally, the UE and base station may communicate information (e.g., capability information, configuration information, resource grants, etc.) to facilitate the compression, decompression, and communication of measurement data.

In some cases, a UE—such as a UE 115 or 215—may perform a measurement operation, or multiple measurement operations, over time. For example, the UE may monitor a channel for RSs at periodic or aperiodic time intervals and may determine channel measurements based on the received RSs. Additionally or alternatively, one or more sensors at the UE may continuously, periodically, or aperiodically record data based on sensor readings. The measurement operation(s) may provide channel measurements, RSRP measurements, radio resource management (RRM) related measurements, other signaling related measurements, position or sensor measurements (e.g., semi-static measurements), or a combination thereof related to one or more base stations (e.g., such as base stations 105 or 205 supporting one or more cells), one or more sensors, one or more RATs, or some combination thereof. These measurements may change over time (e.g., based on the movement of the UE, changing channel conditions, changing load distributions, etc.). As such, the UE may repeatedly report one or more of the measurements to a base station. In dynamic systems (e.g., systems with frequently changing conditions, supporting a number of UEs above a threshold number of UEs, etc.), these measurements may change rapidly, and the UEs may determine—or be configured—to frequently transmit indications of the current measurements for the UEs (e.g., with a frequency greater than a threshold reporting frequency). In this way, a base station may quickly react to changing conditions in the system (e.g., based on the frequent measurement reporting) to improve system optimization. However, such frequent measurement reporting may increase the signaling load on the system.

The UE may implement an auto-encoder 310 to reduce the signaling overhead associated with the measurement reporting. The UE may input measurements 305 to the auto-encoder 310. During NN training, the auto-encoder 310 may train an encoder NN (e.g., at the encoder 315) to efficiently compress the input measurements 305 into an encoder output 320. Additionally, the auto-encoder 310 may train a decoder NN (e.g., at the decoder 325) to reconstruct, or otherwise extract, the measurements (e.g., decompress the encoder output 320) as output measurements 330. As such, the encoder output 320 may correspond to the decoder input.

In some examples, the UE may continuously train the NNs during measurement reporting. In some such examples, the UE may maintain a current operating version of the NNs and a training version of the NNs. The UE may update the current operating version to the training version upon sending the latest training version NN weights to the base station for decoding (e.g., and, in some cases, upon receiving confirmation that the base station successfully received the weights and is implementing the latest training version of the decoder NN). In some other examples, the UE may train the NNs periodically or aperiodically (e.g., based on measurement information stored at the UE since a previous training period). For example, the UE may train the NNs according to a schedule which may be based on the available processing resources of the UE (e.g., the UE may train the NNs overnight or during some other time period of relatively low activity by the UE). In other examples, the base station may request updated decoder NN weights from the UE, and this request may trigger the UE to train the NNs at the encoder 315 and decoder 325 and to feedback the updated decoder NN weights to the base station. In some cases, the UE may flush historical measurement information from memory once the measurement information is used to train the NNs. In yet other examples, the UE may identify a threshold performance increase associated with switching from a current operating version of the NNs to a training version of the NNs, triggering the UE to feedback information about the training version of the decoder NN to the base station and update the current operating version to the training version of the NNs.

Training the NNs may involve unsupervised learning, supervised learning, or a combination of both. For example, the UE may train the encoder 315 according to one or more machine learning algorithms in an NN. The NNs at the encoder 315, the decoder 325, or both may include any number of machine learning layers (e.g., convolution layers, fully connected layers, or some combination thereof). The UE may implement any machine learning techniques to train the NNs at the encoder 315, the decoder 325, or both. For example, the UE may implement deep learning (e.g., using a deep recurrent network), backpropagation, linear regression, a K-means model, a random forest model, or any combination of these or other machine learning techniques to train one or both of the auto-encoder NNs. The NN training may be iterative, such that the UE trains an NN based on a current version of the NN and measurements attained since the current version of the NN was implemented (e.g., rather than starting training from scratch using a full set of historical measurements). Such an iterative training process may reduce the processing overhead associated with training the NNs and may reduce the amount of historical measurement information that the UE stores for the NN training. During the training process, the UE may apply the layers to the measurement input 305 to compress the data from the one or more base stations, sensors, RATs, etc. The UE may feed the compressed data back through the decoder 325 to determine a number of decoding coefficients or parameters for the decoder NN.

During training, the UE may update the encoder weights, encoder layers, decoder weights, decoder layers, or some combination thereof based on feedback information. For example, the UE may update the encoder weights based on a performance metric for the encoding. Such a performance metric may be a metric measuring the level of compression achieved by the encoder NN (e.g., comparing the number of bits associated with the encoder output 320 to the number of bits associated with the input measurements 305), a metric measuring the reliability of extracting the input measurements 305 from the encoder output 320 using the decoder NN, a metric measuring the computational complexity involved in the compression, a metric measuring the system performance based on the encoder NN, or some combination thereof. Similarly, the UE may update the decoder weights based on a performance metric for the decoding. Such a performance metric may be a metric measuring the similarity between the output measurements 330 and the input measurements 305, a metric measuring the computational complexity involved in the decompression, a metric measuring the system performance based on the encoder output 320, or some combination thereof.

The UE may transmit NN parameters to a base station (e.g., over an uplink channel). In some cases, the UE may transmit the parameters according to a relatively slow time scale (e.g., as compared to the time scale for reporting the UE measurements). The base station may update a decoder NN implemented at the base station based on the received NN parameters. For example, the UE may transmit an indication of the NN decoder weights, and the base station may implement a decoder NN for decompressing the encoder output 320 using the received NN decoder weights. By implementing the decoder NN, the base station may determine output measurements 330 from a compressed encoder output 320 (e.g., a compressed encoder output 320 received from a UE) according to the trained decoding parameters.

In some examples, each UE supporting auto-encoder functionality may perform separate machine learning to determine a UE-specific encoder NN and decoder NN. A base station may store a separate decoder NN for each UE communicating with the base station. In some cases, the base station may maintain a record of UE-specific decoder NNs (e.g., in case a UE reconnects to the base station at a later time). In some other examples, a test UE may train the NNs, and a set of UEs may be configured with the encoder NN determined by the test UE. In yet other examples, a base station may configure a set of UEs with an encoder NN (e.g., where the base station received an indication of the trained encoder NN from a UE). For example, the base station may receive indications of multiple trained encoder NNs, may select one trained encoder NN, and may configure the set of UEs to operate using the selected trained encoder NN.

Using the trained NNs, a UE and a base station may communicate measurement information. For example, the UE may input a set of measurements into the trained encoder NN to determine an encoder output 320. The UE may transmit this encoder output 320 (e.g., in some cases, following additional message encoding) to the base station. The base station may receive the encoder output 320 and may decode the encoder output 320 using the trained decoder NN. For example, the decoding coefficients for the decoder NN may allow a decoder 325 at the base station to decode the compressed encoder output 320. In some cases, the compressed encoder output 320 may be a compact set of informative features associated with the measurements, their statistics (e.g., average measurements, weighted average measurements, maximum or minimum measurements, etc.), or a combination thereof. The base station may decode the compressed encoder output 320 to extract the output measurements 330 (e.g., the informative features, statistics, or the combination), for example, using the received decoding coefficients from the trained NN. In some cases, the base station may use the extracted features, statistics, or a combination for RRM or positioning related decisions. Additionally or alternatively, the base station may use the extracted features, statistics or a combination for network optimization (e.g., relatively efficient resource allocation, load distribution across base stations, RATs, or both, etc.) or improving user experience (e.g., increased efficiency at the UE, which may improve battery life as well as reduce signaling overhead).

In some cases, the UE and base station may perform signaling operations to support the compressed measurement feedback. For example, the UE may inform the base station of a capability related to compressing measurements (e.g., an ability to compress measurements from multiple base stations, multiple RATs, multiple sensors, or a combination thereof). In some cases, the UE may transmit a capability report including an indication of the UE's capability to compress multiple measurements using an encoder NN. In some examples, the base station may transmit an RRC message to configure the UE to operate in a mode (e.g., related to compressing measurements). For example, the base station may enable the UE to operate in a compression enabled mode. In some aspects, the base station may determine whether to configure the UE to operate in the measurement compression enabled mode based on the UE's capability report (e.g., based on whether the UE is capable of compressing measurements using an encoder NN). In some examples, the base station may inform the UE of which inputs to use for the encoder (e.g., RSRP, position, sensor measurements, etc.). For example, the base station may semi-statically configure the UE with measurement types for the input measurements 305 to combine (e.g., compress) using the encoder NN (e.g., via RRC signaling).

In some examples, the base station may configure (e.g., semi-statically) the periodicity or schedule at which the UE reports or updates the decoder coefficients or weights. In some cases, the base station may update the frequency of the decoder NN feedback information from the UE based on the system (e.g., how dynamically the system conditions change). Additionally or alternatively, the base station may semi-statically or dynamically provide a grant for uplink transmission of the coefficients, other decoder information, the encoder output 320, or some combination thereof (e.g., over a physical uplink shared channel (PUSCH)). In some examples, the base station may configure (e.g., semi-statically configure) priority rules corresponding to uplink feedback, such as PUSCH feedback, of the compressed encoder output 320 or coefficients. For example, the base station may configure the UE such that aperiodic CSI feedback has a relatively higher priority than the measurement feedback (e.g., the encoder output 320) and periodic CSI feedback has a relatively lower priority than the measurement feedback. In some cases, the UE may preempt transmission of the measurement feedback based on a message with a relatively higher priority than the measurement feedback. In some other cases, the UE may preempt transmission of a message based on the measurement feedback due to the message having a relatively lower priority than the measurement feedback.

Figure 4:
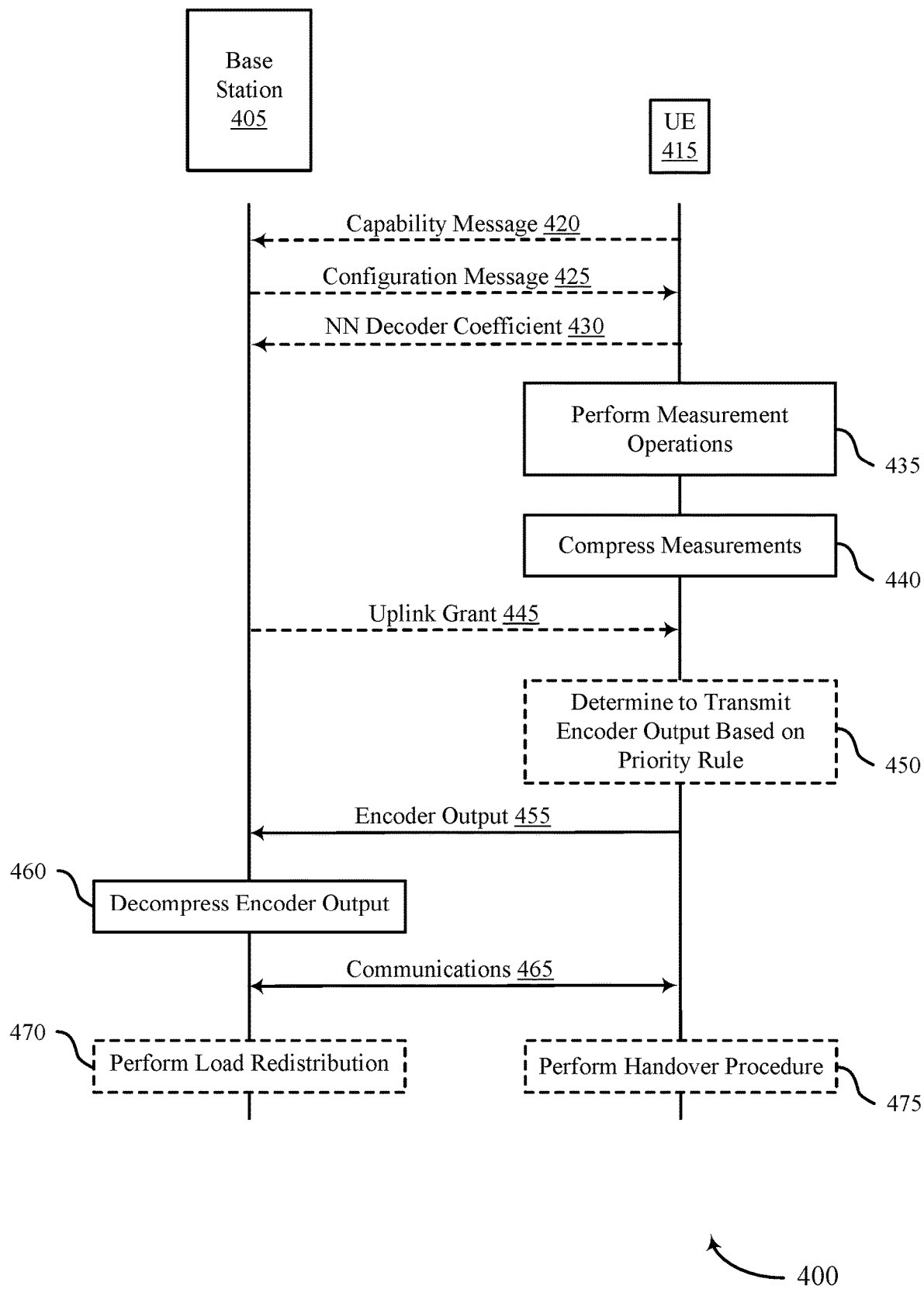
FIG. 4 illustrates an example of a process flow that supports compressed measurement feedback using an encoder NN, in accordance with one or more aspects of the present disclosure.

FIG. 4 illustrates an example of a process flow 400 that supports compressed measurement feedback using an encoder NN, in accordance with one or more aspects of the present disclosure. In some examples, process flow 400 may implement aspects of wireless communications systems 100 and 200. The process flow 400 may illustrate an example of measurement compression at UE 415 and decompression at base station 405. Alternative examples of the following may be implemented, where some processes are performed in a different order than described or are not performed at all. In some cases, processes may include additional features not mentioned below, or further processes may be added.

At 420, UE 415 may transmit a capability message to base station 405. For example, UE 415 may transmit a message indicating that UE 415 has the capability of compressing a number of measurements using an encoder NN. In some cases, UE 415 may perform an RRC setup procedure with base station 405, which may include transmitting the message (e.g., the UE capability report) to base station 405.

At 425, base station 405 may transmit a configuration message to UE 415. In some cases, the configuration message may configure UE 415 to operate in a compression enabled mode. Additionally or alternatively, base station 405 may transmit an indication of the measurements on which to perform compression. In some examples, the configuration message may indicate a periodicity for NN decoder coefficient feedback. Additionally or alternatively, the configuration message may indicate a priority rule for the UE transmitting an encoder output. In some cases, the information described herein with reference to 425 may be transmitted in a single configuration message. In some other cases, the information described herein with reference to 425 may be transmitted in multiple different configuration messages.

In some examples, UE 415 may include an auto-encoder with an encoder NN and a decoder NN. In some cases, UE 415 may train the encoder NN based on historical measurements at UE 415, a performance metric from UE 415, or both. Additionally or alternatively, UE 415 may train the decoder NN at the UE 415 based on the trained encoder NN. In some cases, UE 415 may transmit an indication of the trained decoder NN to base station 405. For example, at 430, UE 415 may transmit a set of NN decoder coefficients to base station 405 (e.g., one or more decoder coefficients based on the trained NN). For example, UE 415 may periodically transmit NN decoder coefficients to base station 405 based on the periodicity for NN decoder coefficient feedback configured at 425.

At 435, UE 415 may perform a measurement operation to obtain a number of measurements corresponding to a number of bits for reporting the measurements. In some cases, the measurements may correspond to one or more base stations, one or more sensors at UE 415, one or more RATs, or a combination thereof. Additionally or alternatively, the measurements may include an RSRP measurement, an RSRQ measurement, an RSSI, an RSTD, a GNSS measurement, an RTT measurement, a sensor output, or a combination of these or other measurements performed by UE 415.

At 440, UE 415 may compress measurements from the measurement operation at 435 using the trained encoder NN. In some cases, the compressed measurements may be an encoder output indicating the measurements. The encoder output may include a number of bits that is less than the number of bits from 435 (e.g., the number of bits for reporting the measurements in separate fields). In some examples, UE 415 may compress the multiple measurements based on operating in a compression enabled mode (which may be configured by base station 405 at 425). Additionally or alternatively, UE 415 may determine which measurements to input to the encoder NN based on an indication of the measurements from base station 405 (e.g., indicated at 425).

At 445, base station 405 may transmit an uplink grant that may specify resources for an encoder output from UE 415. In some cases, the uplink grant may semi-statically grant a periodic resource for a periodic transmission of the encoder output. In other cases, the uplink grant may dynamically grant a resource for a transmission of the encoder output.

At 450, UE 415 may determine to transmit an encoder output on a resource based on a priority rule. In some cases, UE 415 may determine to transmit the encoder output on an initial resource. Subsequently, UE 415 may determine a message scheduled for communication overlaps with the initial resource. UE 415 may preempt transmission of the encoder output based on the message having a relatively higher priority than the encoder output according to the priority rule, where the encoder output may be transmitted on an updated resource instead (e.g., based on the preempting). In some other cases, UE 415 may determine a message scheduled for communication partially overlaps with the granted resource for measurement feedback. UE 415 may preempt communication of the message based on the message having a relatively lower priority than the encoder output according to the priority rule, where the encoder output may be transmitted on the resource based on the preempting.

At 455, UE 415 may transmit the encoder output to base station 405. For example, UE 415 may transmit the encoder output to base station 405 based on an uplink grant. In some cases, the encoder output may be the compressed measurements from 440. For example, the encoder output may include a feature indicating two or more measurements of the number of measurements, a statistic associated with multiple measurements, or both.

At 460, base station 405 may decompress the encoder output from UE 415 using a decoder NN to obtain a number of measurements. The decoder NN may be based on the NN decoder coefficients received at 430. The measurements may correspond to a number of bits for reporting the measurements that is greater than the number of bits included in the encoder output. In some examples, base station 405 may decompress the encoder output based on the capability reported by the UE 415 at 420.

At 465, base station 405 and UE 415 may communicate based on the measurements. For example, at 470, base station 405 may perform a load redistribution across a number of base stations, a number of RATs, or both. Base station 405 may perform the load redistribution for a number of UEs including UE 415 based on measurements received from multiple UEs. Additionally or alternatively, at 475, base station 405 may initiate a handover of UE 415 to a different base station. Subsequently, UE 415 may perform the handover procedure to the different base station. In some cases, the handover procedure may be based on the encoder output.

Figure 5:
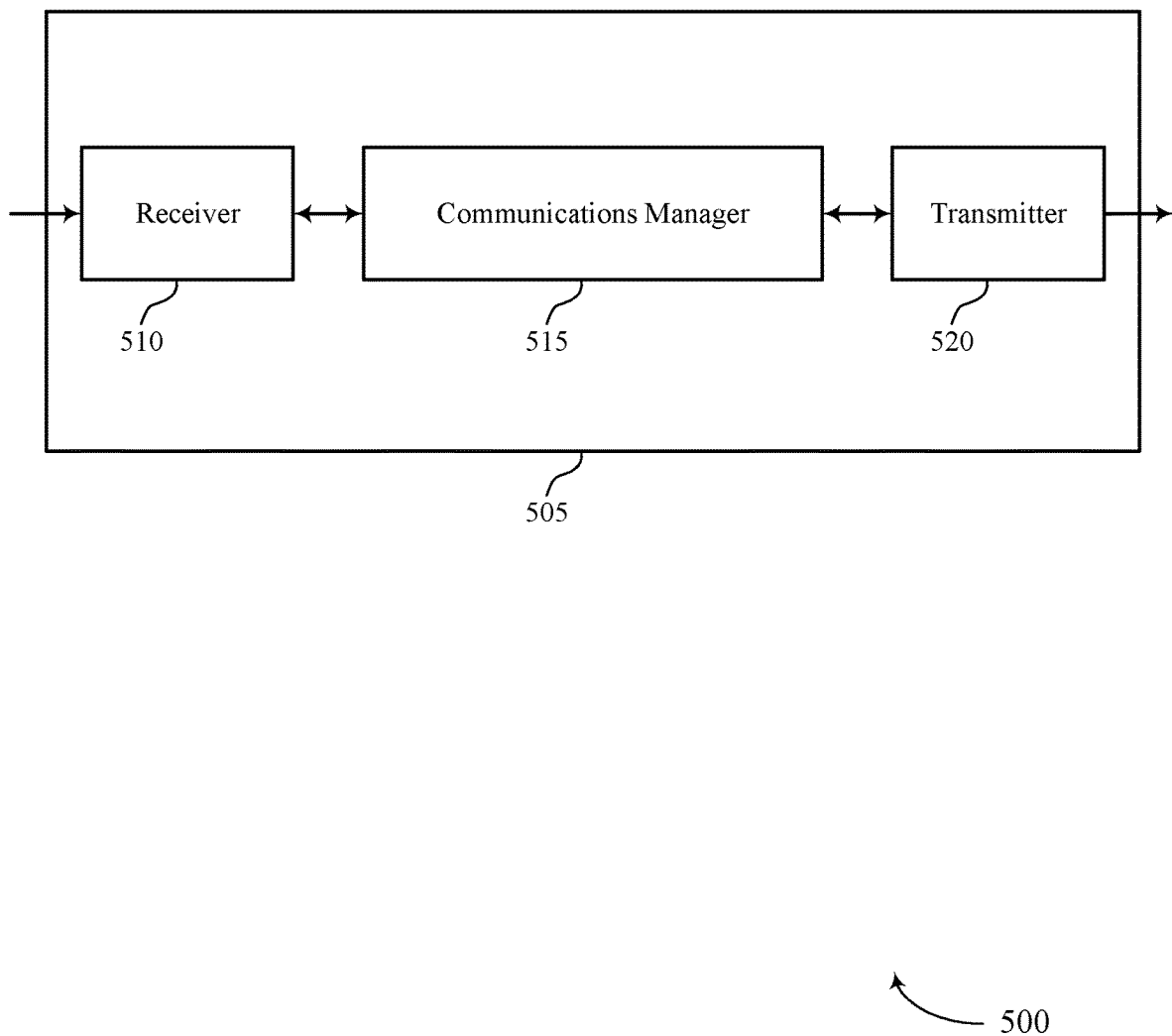
FIGS. 5 and 6 show block diagrams of devices that support compressed measurement feedback using an encoder NN, in accordance with one or more aspects of the present disclosure.

FIG. 5 shows a block diagram 500 of a device 505 that supports compressed measurement feedback using an encoder NN, in accordance with one or more aspects of the present disclosure. The device 505 may be an example of aspects of a UE 115 as described herein. The device 505 may include a receiver 510, a communications manager 515, and a transmitter 520. The device 505 may also include a processor. Each of these components may be in communication with one another (e.g., via one or more buses).

The receiver 510 may receive information such as packets, user data, or control information associated with various information channels (e.g., control channels, data channels, and information related to compressed measurement feedback using an encoder NN, etc.). Information may be passed on to other components of the device 505. The receiver 510 may be an example of aspects of the transceiver 820 described with reference to FIG. 8. The receiver 510 may utilize a single antenna or a set of antennas.

The communications manager 515 may perform measurement operations to obtain a set of measurements corresponding to a first number of bits for reporting the set of measurements (e.g., reporting the raw measurements using separate bit representations, for example, in separate fields). The communications manager 515 may compress the set of measurements using an encoder NN to obtain an encoder output indicating the set of measurements, the encoder output including a second number of bits that is less than the first number of bits for reporting the set of measurements. The communications manager 515 may transmit, to a base station, the encoder output. In some cases, the communications manager 515 may be an example of aspects of the communications manager 810 described herein.

The actions performed by the communications manager 515 as described herein may support improvements in communications. In one or more aspects, a UE may compress measurements according to an encoder NN and transmit the encoder output to a base station. Compressing measurements may enable techniques for reducing signaling overhead in the system by reducing the number of bits used to convey measurement information. For example, the UE may report correlated measurement information using a single encoder output that indicates the raw measurements, statistics related to the raw measurements, or both.

Based on compressing the measurements as described herein, a processor of a UE (e.g., a processor controlling the receiver 510, the communications manager 515, the transmitter 520, or a combination thereof) may improve communication efficiency in the system. For example, the measurement compression techniques described herein may leverage an NN encoder and decoder to perform measurement feedback, which may realize reduced signaling overhead and power savings (e.g., by reporting multiple measurements in a combined encoder output value), among other benefits.

The communications manager 515 may be an example of means for performing compressed measurement feedback using an encoder NN as described herein. The communications manager 515, or its sub-components, may be implemented in hardware, code (e.g., software or firmware) executed by a processor, or any combination thereof. If implemented in code executed by a processor, the functions of the communications manager 515, or its sub-components may be executed by a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described in the present disclosure.

In another implementation, the communications manager 515, or its sub-components, may be implemented in code (e.g., as communications management software or firmware) executed by a processor, or any combination thereof. If implemented in code executed by a processor, the functions of the communications manager 515, or its sub-components may be executed by a general-purpose processor, a digital signal processor (DSP), an application-specific integrated circuit (ASIC), a field programmable gate array (FPGA) or other programmable logic device.

In some examples, the communication manager 515 may be configured to perform various operations (e.g., receiving, determining, transmitting) using or otherwise in cooperation with the receiver 510, the transmitter 520, or both.

The communications manager 515, or its sub-components, may be physically located at various positions, including being distributed such that portions of functions are implemented at different physical locations by one or more physical components. In some examples, the communications manager 515, or its sub-components, may be a separate and distinct component in accordance with various aspects of the present disclosure. In some examples, the communications manager 515, or its sub-components, may be combined with one or more other hardware components, including but not limited to an input/output (I/O) component, a transceiver, a network server, another computing device, one or more other components described in the present disclosure, or a combination thereof in accordance with various aspects of the present disclosure.

The transmitter 520 may transmit signals generated by other components of the device 505. In some examples, the transmitter 520 may be collocated with a receiver 510 in a transceiver module. For example, the transmitter 520 may be an example of aspects of the transceiver 820 described with reference to FIG. 8. The transmitter 520 may utilize a single antenna or a set of antennas.

Figure 6:
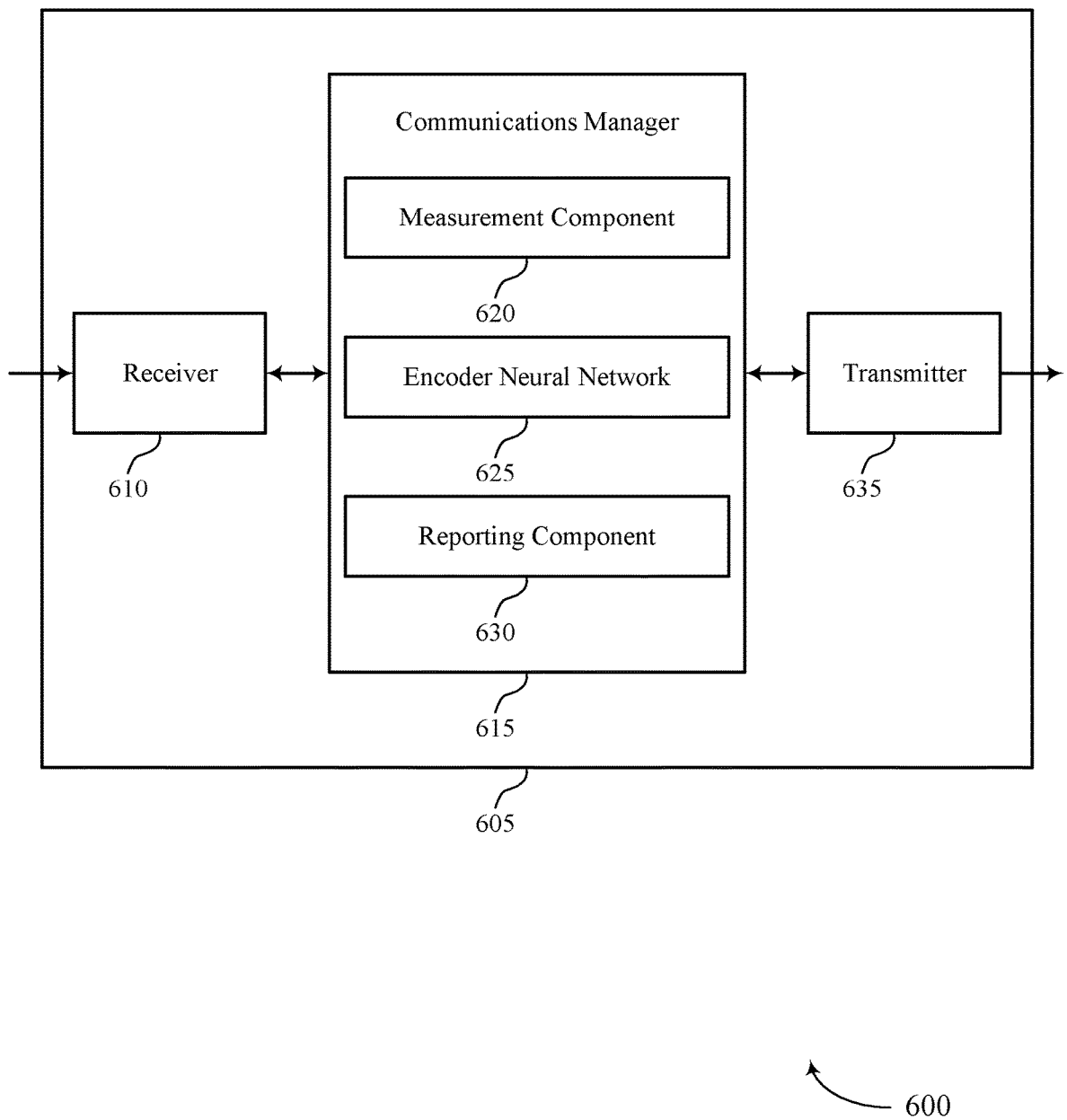

FIG. 6 shows a block diagram 600 of a device 605 that supports compressed measurement feedback using an encoder NN, in accordance with one or more aspects of the present disclosure. The device 605 may be an example of aspects of a device 505 or a UE 115 as described herein. The device 605 may include a receiver 610, a communications manager 615, and a transmitter 635. The device 605 may also include a processor. Each of these components may be in communication with one another (e.g., via one or more buses).

The receiver 610 may receive information such as packets, user data, or control information associated with various information channels (e.g., control channels, data channels, and information related to compressed measurement feedback using an encoder NN, etc.). Information may be passed on to other components of the device 605. The receiver 610 may be an example of aspects of the transceiver 820 described with reference to FIG. 8. The receiver 610 may utilize a single antenna or a set of antennas.

The communications manager 615 may be an example of aspects of the communications manager 515 as described herein. The communications manager 615 may include a measurement component 620, an encoder NN 625, and a reporting component 630. The communications manager 615 may be an example of aspects of the communications manager 810 described herein.

The measurement component 620 may perform measurement operations to obtain a set of measurements corresponding to a first number of bits for reporting the set of measurements. The encoder NN 625 may compress the set of measurements using an encoder NN to obtain an encoder output indicating the set of measurements, the encoder output including a second number of bits that is less than the first number of bits for reporting the set of measurements. The reporting component 630 may transmit, to a base station, a set of NN decoder coefficients for decoding the encoder output and the encoder output.

The transmitter 635 may transmit signals generated by other components of the device 605. In some examples, the transmitter 635 may be collocated with a receiver 610 in a transceiver module. For example, the transmitter 635 may be an example of aspects of the transceiver 820 described with reference to FIG. 8. The transmitter 635 may utilize a single antenna or a set of antennas.

Figure 7:
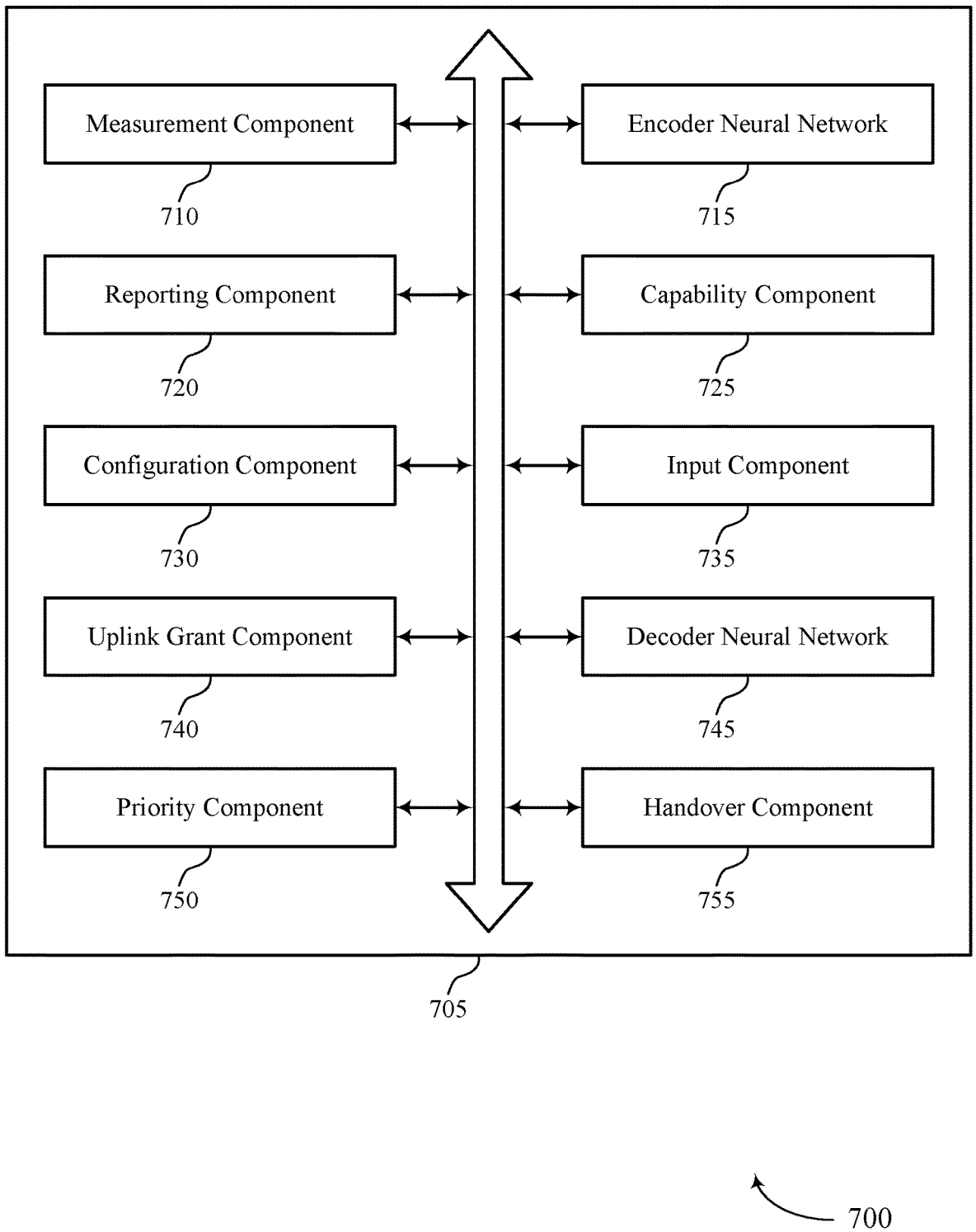
FIG. 7 shows a block diagram of a communications manager that supports compressed measurement feedback using an encoder NN, in accordance with one or more aspects of the present disclosure.

FIG. 7 shows a block diagram 700 of a communications manager 705 that supports compressed measurement feedback using an encoder NN, in accordance with one or more aspects of the present disclosure. The communications manager 705 may be an example of aspects of a communications manager 515, a communications manager 615, or a communications manager 810 described herein. The communications manager 705 may include a measurement component 710, an encoder NN 715, a reporting component 720, a capability component 725, a configuration component 730, an input component 735, an uplink grant component 740, a decoder NN 745, a priority component 750, and a handover component 755. Each of these modules may communicate, directly or indirectly, with one another (e.g., via one or more buses). The communications manager 705 may be implemented at a UE 115.

The measurement component 710 may perform measurement operations to obtain a set of measurements corresponding to a first number of bits for reporting the set of measurements. In some cases, the set of measurements corresponds to a set of base stations, a set of sensors at the UE, a set of RATs, or a combination thereof. In some cases, the set of measurements includes an RSRP measurement, an RSRQ measurement, an RSSI, an RSTD, a GNSS measurement, an RTT measurement, a sensor output, or a combination thereof.

The encoder NN 715 may compress the set of measurements using an encoder NN to obtain an encoder output indicating the set of measurements, the encoder output including a second number of bits that is less than the first number of bits for reporting the set of measurements. In some cases, the encoder output includes a feature indicating at least two measurements of the set of measurements or a statistic associated with the set of measurements or both. The reporting component 720 may transmit, to a base station, a set of NN decoder coefficients for decoding the encoder output and the encoder output.

The capability component 725 may transmit, to the base station, a message indicating that the UE has the capability of compressing the set of measurements using the encoder NN. In some examples, the capability component 725 may perform an RRC setup procedure including transmitting the message.

The configuration component 730 may receive, from the base station, a configuration message configuring the UE to operate in a compression enabled mode, where the compressing the set of measurements using the encoder NN is based on the UE operating in the compression enabled mode.

The input component 735 may receive, from the base station, an indication of the set of measurements, where the compressing the set of measurements using the encoder NN may further involve the input component 735 inputting the set of measurements into the encoder NN based on the indication of the set of measurements.

The uplink grant component 740 may receive, from the base station, an uplink grant for the encoder output, where the encoder output is transmitted based on the uplink grant. In some cases, the uplink grant semi-statically grants a periodic resource for a periodic transmission of the encoder output. In some other cases, the uplink grant dynamically grants a resource for a transmission of the encoder output.

In some examples, the decoder NN 745 may receive, from the base station, a configuration message indicating a periodicity for NN decoder coefficient feedback, where the set of NN decoder coefficients is periodically transmitted to the base station based on the periodicity for NN decoder coefficient feedback.

In some examples, the encoder NN 715 may train the encoder NN at the UE based on historical measurements at the UE or a UE performance metric or both. In some examples, the decoder NN 745 may train a decoder NN at the UE based on training the encoder NN at the UE. In some examples, the decoder NN 745 may transmit, to the base station, an indication of the trained decoder NN. In some cases, the UE includes an auto-encoder including the encoder NN and the decoder NN.

The priority component 750 may receive, from the base station, a configuration message indicating a priority rule for transmitting the encoder output and may determine to transmit the encoder output on a resource based on the priority rule. In some cases, the resource may be an updated resource. For example, the priority component 750 may determine to transmit the encoder output on an initial resource, may determine that a message scheduled for communication at least partially overlaps with the initial resource, and may preempt transmission of the encoder output based on the message having a higher priority than the encoder output according to the priority rule, where the encoder output is transmitted on the updated resource (e.g., rather than the initial resource) based on the preempting. In some other cases, the priority component 750 may determine that a message scheduled for communication at least partially overlaps with the resource and may preempt communication of the message based on the message having a lower priority than the encoder output according to the priority rule, where the encoder output is transmitted on the resource based on the preempting.

The handover component 755 may perform a handover procedure from the base station (e.g., a first base station) to a second base station different from the first base station based on the transmitting the encoder output.

Figure 8:
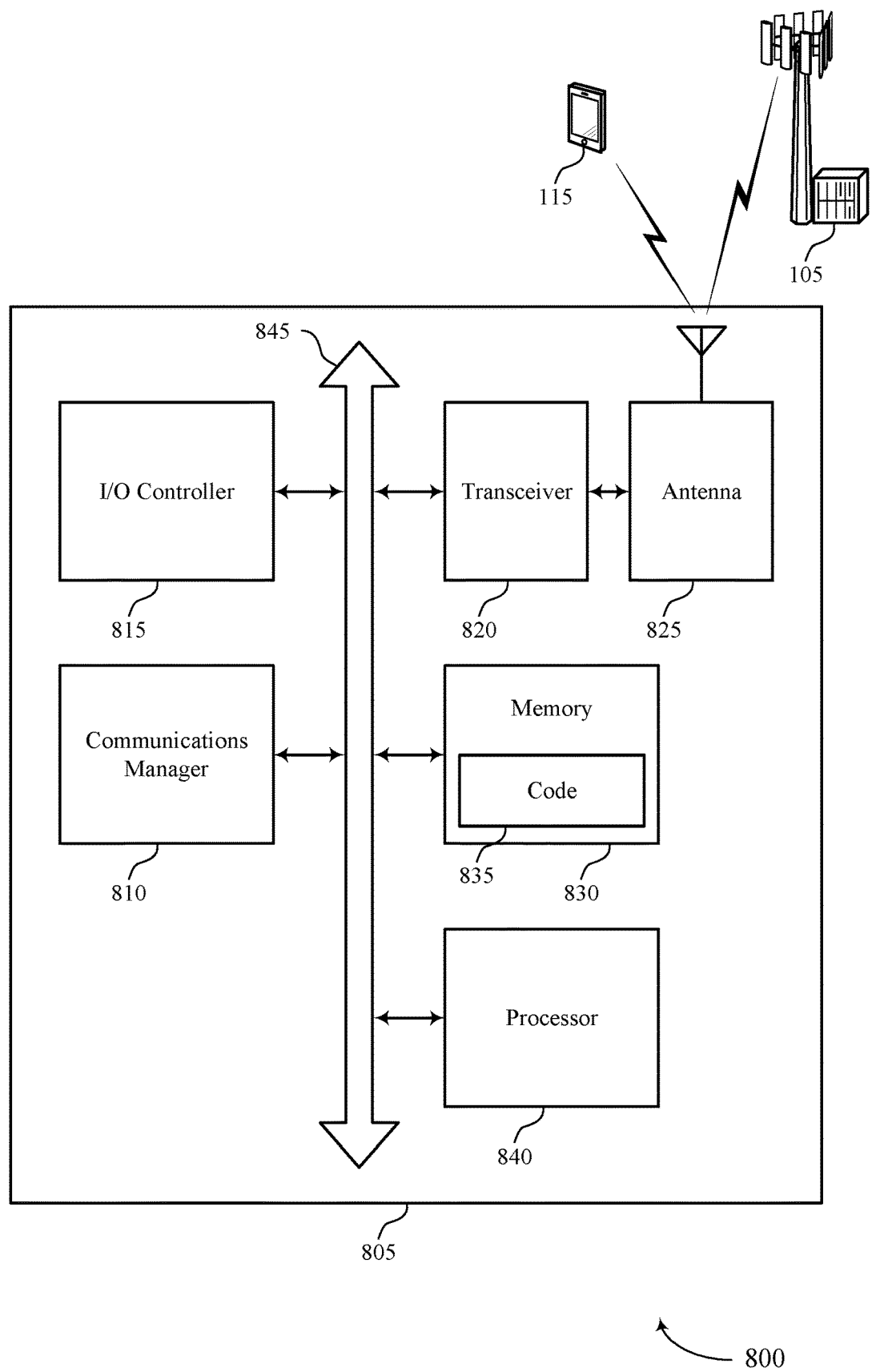
FIG. 8 shows a diagram of a system including a device that supports compressed measurement feedback using an encoder NN, in accordance with one or more aspects of the present disclosure.

FIG. 8 shows a diagram of a system 800 including a device 805 that supports compressed measurement feedback using an encoder NN, in accordance with one or more aspects of the present disclosure. The device 805 may be an example of or include the components of device 505, device 605, or a UE 115 as described herein. The device 805 may include components for bi-directional voice and data communications including components for transmitting and receiving communications, including a communications manager 810, an I/O controller 815, a transceiver 820, an antenna 825, memory 830, and a processor 840. These components may be in electronic communication via one or more buses (e.g., bus 845).

The communications manager 810 may perform measurement operations to obtain a set of measurements corresponding to a first number of bits for reporting the set of measurements and may compress the set of measurements using an encoder NN to obtain an encoder output indicating the set of measurements, the encoder output including a second number of bits that is less than the first number of bits for reporting the set of measurements. The communications manager 810 may transmit, to a base station, the encoder output.

The I/O controller 815 may manage input and output signals for the device 805. The I/O controller 815 may also manage peripherals not integrated into the device 805. In some cases, the I/O controller 815 may represent a physical connection or port to an external peripheral. In some cases, the I/O controller 815 may utilize an operating system such as iOS®, ANDROID®, MS-DOS®, MS-WINDOWS®, OS/2®, UNIX®, LINUX®, or another known operating system. In other cases, the I/O controller 815 may represent or interact with a modem, a keyboard, a mouse, a touchscreen, or a similar device. In some cases, the I/O controller 815 may be implemented as part of a processor. In some cases, a user may interact with the device 805 via the I/O controller 815 or via hardware components controlled by the I/O controller 815.

The transceiver 820 may communicate bi-directionally, via one or more antennas, wired, or wireless links as described above. For example, the transceiver 820 may represent a wireless transceiver and may communicate bi-directionally with another wireless transceiver. The transceiver 820 may also include a modem to modulate the packets and provide the modulated packets to the antennas for transmission, and to demodulate packets received from the antennas.

In some cases, the wireless device may include a single antenna 825. However, in some cases the device may have more than one antenna 825, which may be capable of concurrently transmitting or receiving multiple wireless transmissions.

The memory 830 may include random access memory (RAM) and read-only memory (ROM). The memory 830 may store computer-readable, computer-executable code 835 including instructions that, when executed, cause the processor to perform various functions described herein. In some cases, the memory 830 may contain, among other things, a basic I/O system (BIOS) which may control basic hardware or software operation such as the interaction with peripheral components or devices.

The processor 840 may include an intelligent hardware device (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, the processor 840 may be configured to operate a memory array using a memory controller. In other cases, a memory controller may be integrated into the processor 840. The processor 840 may be configured to execute computer-readable instructions stored in a memory (e.g., the memory 830) to cause the device 805 to perform various functions (e.g., functions or tasks supporting compressed measurement feedback using an encoder NN).

The code 835 may include instructions to implement aspects of the present disclosure, including instructions to support wireless communications. The code 835 may be stored in a non-transitory computer-readable medium such as system memory or other type of memory. In some cases, the code 835 may not be directly executable by the processor 840 but may cause a computer (e.g., when compiled and executed) to perform functions described herein.

Figure 9:
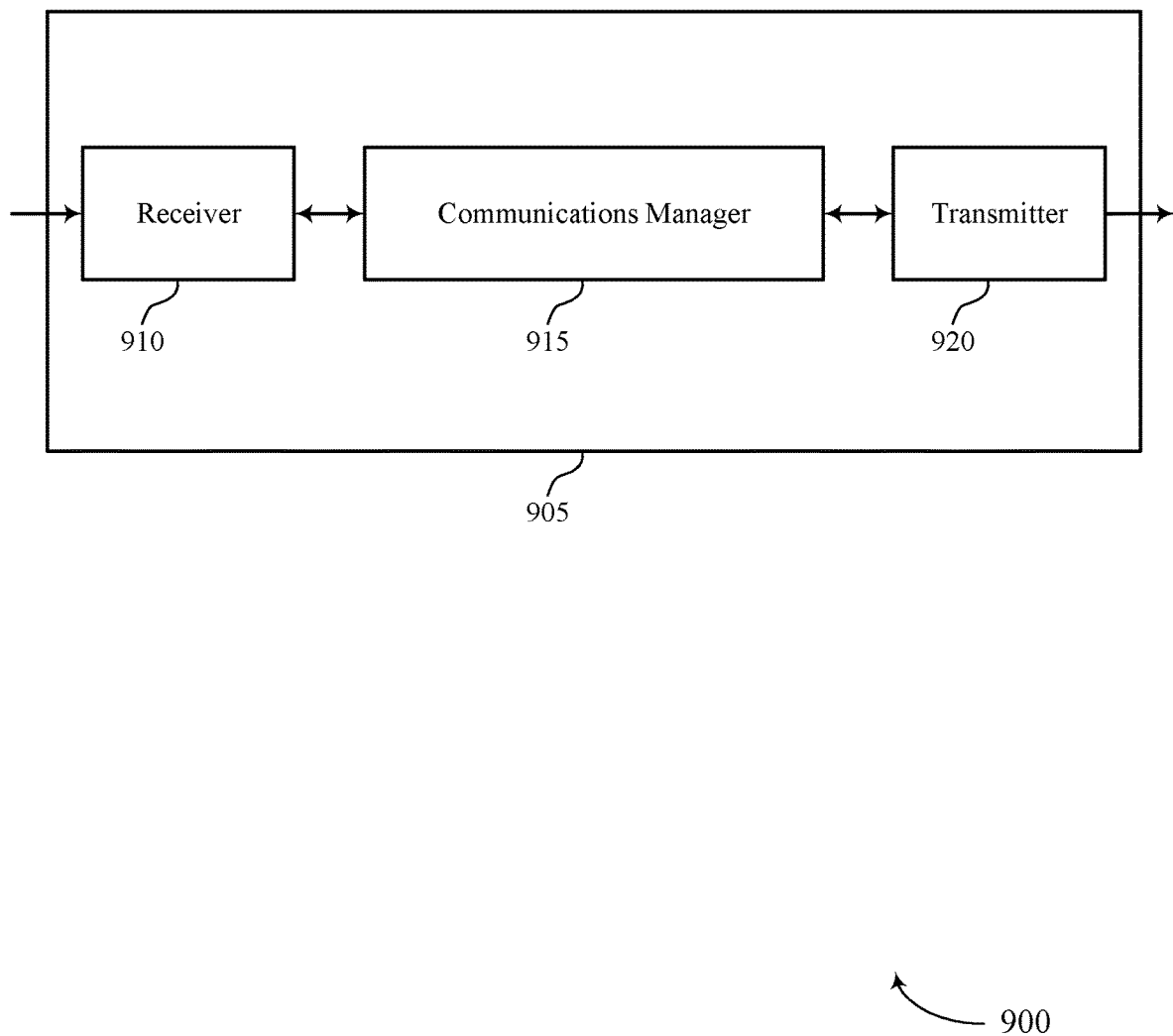
FIGS. 9 and 10 show block diagrams of devices that support compressed measurement feedback using an encoder NN, in accordance with one or more aspects of the present disclosure.

FIG. 9 shows a block diagram 900 of a device 905 that supports compressed measurement feedback using an encoder NN, in accordance with one or more aspects of the present disclosure. The device 905 may be an example of aspects of a base station 105 as described herein. The device 905 may include a receiver 910, a communications manager 915, and a transmitter 920. The device 905 may also include a processor. Each of these components may be in communication with one another (e.g., via one or more buses).

The receiver 910 may receive information such as packets, user data, or control information associated with various information channels (e.g., control channels, data channels, and information related to compressed measurement feedback using an encoder NN, etc.). Information may be passed on to other components of the device 905. The receiver 910 may be an example of aspects of the transceiver 1220 described with reference to FIG. 12. The receiver 910 may utilize a single antenna or a set of antennas.

The communications manager 915 may receive, from a UE, an encoder output including a first number of bits, decompress the encoder output using a decoder NN to obtain a set of measurements, the set of measurements corresponding to a second number of bits for reporting the set of measurements (e.g., if the UE reported the raw measurements separately using separate bit representations, for example, in separate fields) that is greater than the first number of bits, and communicate with the UE based on the set of measurements. The communications manager 915 may be an example of aspects of the communications manager 1210 described herein.

The actions performed by the communications manager 915 as described herein may support improvements in communications. In one or more aspects, a base station may receive an encoder output from a UE and decompress the encoder output to determine measurement feedback. Decompressing measurement feedback may enable techniques for improving resource allocation by using a decoder NN at the base station trained according to the measurements at the UE, which may result in more efficient communications (e.g., decreased measurement reporting overhead in the system), among other improvements.

The communications manager 915, or its sub-components, may be implemented in hardware, code (e.g., software or firmware) executed by a processor, or any combination thereof. If implemented in code executed by a processor, the functions of the communications manager 915, or its sub-components may be executed by a general-purpose processor, a DSP, an ASIC, an FPGA or other programmable logic device, discrete gate or transistor logic, discrete hardware components, or any combination thereof designed to perform the functions described in the present disclosure.

The communications manager 915, or its sub-components, may be physically located at various positions, including being distributed such that portions of functions are implemented at different physical locations by one or more physical components. In some examples, the communications manager 915, or its sub-components, may be a separate and distinct component in accordance with various aspects of the present disclosure. In some examples, the communications manager 915, or its sub-components, may be combined with one or more other hardware components, including but not limited to an I/O component, a transceiver, a network server, another computing device, one or more other components described in the present disclosure, or a combination thereof in accordance with various aspects of the present disclosure.

The transmitter 920 may transmit signals generated by other components of the device 905. In some examples, the transmitter 920 may be collocated with a receiver 910 in a transceiver module. For example, the transmitter 920 may be an example of aspects of the transceiver 1220 described with reference to FIG. 12. The transmitter 920 may utilize a single antenna or a set of antennas.

Figure 10:
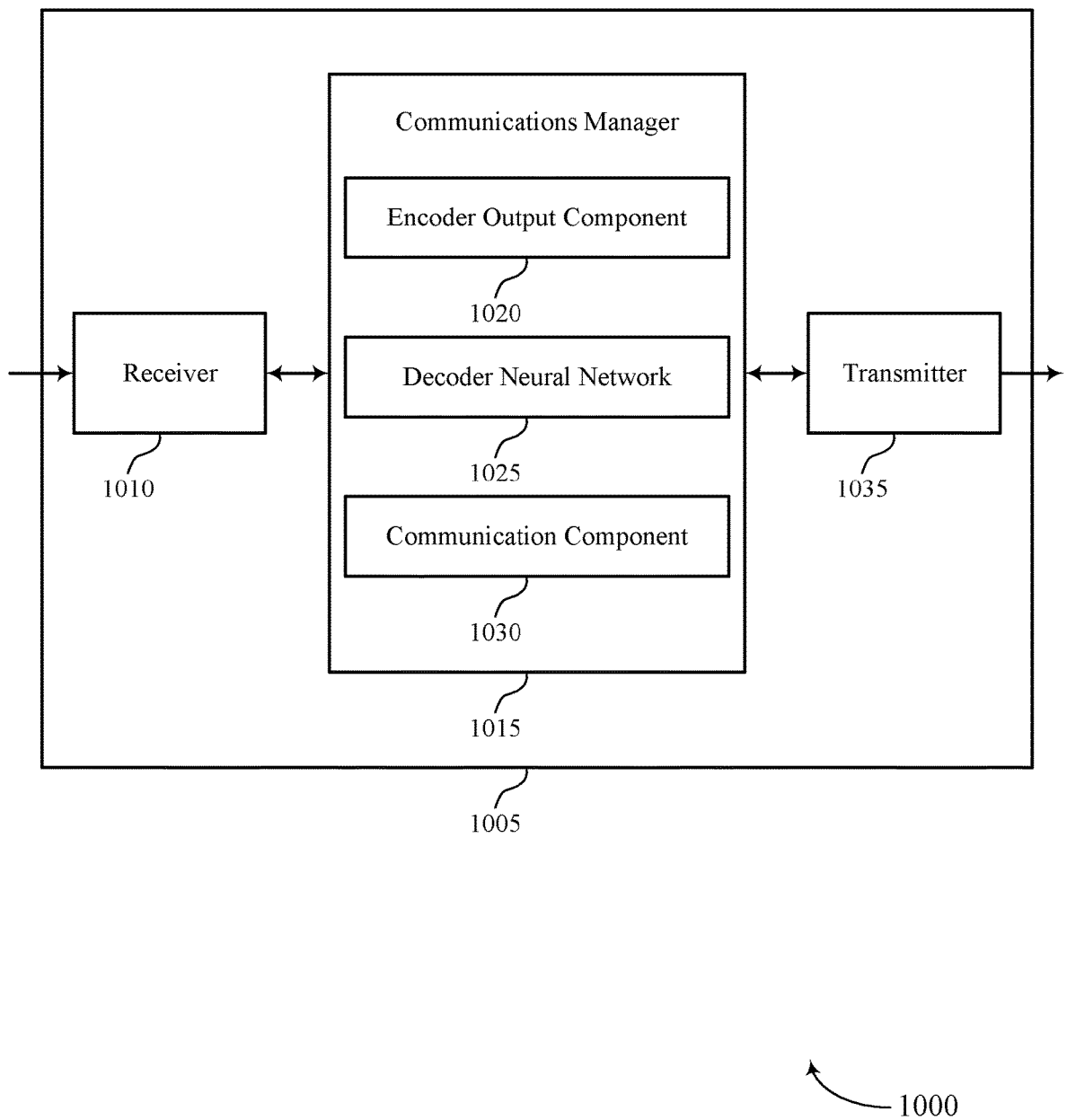

FIG. 10 shows a block diagram 1000 of a device 1005 that supports compressed measurement feedback using an encoder NN, in accordance with one or more aspects of the present disclosure. The device 1005 may be an example of aspects of a device 905 or a base station 105 as described herein. The device 1005 may include a receiver 1010, a communications manager 1015, and a transmitter 1035. The device 1005 may also include a processor. Each of these components may be in communication with one another (e.g., via one or more buses).

The receiver 1010 may receive information such as packets, user data, or control information associated with various information channels (e.g., control channels, data channels, and information related to compressed measurement feedback using an encoder NN, etc.). Information may be passed on to other components of the device 1005. The receiver 1010 may be an example of aspects of the transceiver 1220 described with reference to FIG. 12. The receiver 1010 may utilize a single antenna or a set of antennas.

The communications manager 1015 may be an example of aspects of the communications manager 915 as described herein. The communications manager 1015 may include an encoder output component 1020, a decoder NN 1025, and a communication component 1030. The communications manager 1015 may be an example of aspects of the communications manager 1210 described herein.

The encoder output component 1020 may receive, from a UE, an encoder output including a first number of bits. The decoder NN 1025 may decompress the encoder output using a decoder NN to obtain a set of measurements, the set of measurements corresponding to a second number of bits for reporting the set of measurements that is greater than the first number of bits. The communication component 1030 may communicate with the UE based on the set of measurements.

The transmitter 1035 may transmit signals generated by other components of the device 1005. In some examples, the transmitter 1035 may be collocated with a receiver 1010 in a transceiver module. For example, the transmitter 1035 may be an example of aspects of the transceiver 1220 described with reference to FIG. 12. The transmitter 1035 may utilize a single antenna or a set of antennas.

Figure 11:
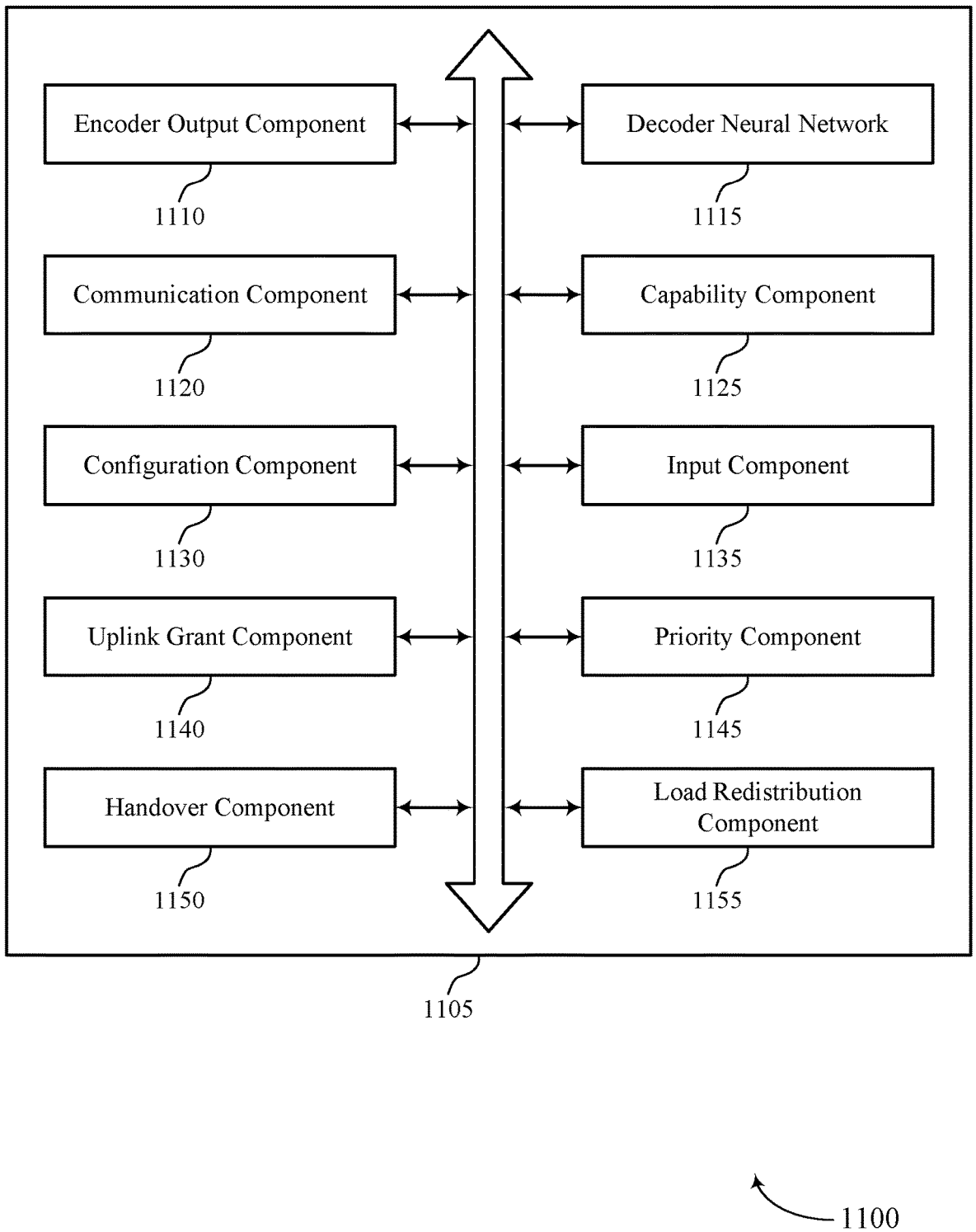
FIG. 11 shows a block diagram of a communications manager that supports compressed measurement feedback using an encoder NN, in accordance with one or more aspects of the present disclosure.

FIG. 11 shows a block diagram 1100 of a communications manager 1105 that supports compressed measurement feedback using an encoder NN, in accordance with one or more aspects of the present disclosure. The communications manager 1105 may be an example of aspects of a communications manager 915, a communications manager 1015, or a communications manager 1210 described herein. The communications manager 1105 may include an encoder output component 1110, a decoder NN 1115, a communication component 1120, a capability component 1125, a configuration component 1130, an input component 1135, an uplink grant component 1140, a priority component 1145, a handover component 1150, and a load redistribution component 1155. Each of these modules may communicate, directly or indirectly, with one another (e.g., via one or more buses). The communications manager 1105 may be implemented by a base station 105.

The encoder output component 1110 may receive, from a UE, an encoder output including a first number of bits. In some cases, the encoder output includes a feature indicating at least two measurements of the set of measurements or a statistic associated with the set of measurements or both.

The decoder NN 1115 may decompress the encoder output using a decoder NN to obtain a set of measurements, the set of measurements corresponding to a second number of bits for reporting the set of measurements that is greater than the first number of bits. In some examples, the decoder NN 1115 may receive, from the UE, a set of NN decoder coefficients and may determine the decoder NN based on the received NN decoder coefficients. In some examples, the decoder NN 1115 may transmit, to the UE, a configuration message indicating a periodicity for NN decoder coefficient feedback, where the set of NN decoder coefficients is periodically received from the UE based on the periodicity for NN decoder coefficient feedback.

The communication component 1120 may communicate with the UE based on the set of measurements. In some cases, the set of measurements corresponds to a set of base stations, a set of sensors at the UE, a set of RATs, or a combination thereof. In some cases, the set of measurements includes an RSRP measurement, an RSRQ measurement, an RSSI, an RSTD, a GNSS measurement, an RTT measurement, a sensor output, or a combination thereof.

The capability component 1125 may receive, from the UE, a message indicating that the UE has the capability of compressing the set of measurements using an encoder NN, where decompressing the encoder output using the decoder NN is based on the message. In some examples, the capability component 1125 may perform an RRC setup procedure with the UE including receiving the message.

The configuration component 1130 may transmit, to the UE, a configuration message configuring the UE to operate in a compression enabled mode, where the encoder output is received based on the UE operating in the compression enabled mode.

The input component 1135 may transmit, to the UE, an indication of the set of measurements for compression, where the encoder output indicates the set of measurements based on the indication of the set of measurements for compression.

The uplink grant component 1140 may transmit, to the UE, an uplink grant for the encoder output, where the encoder output is received based on the uplink grant. In some cases, the uplink grant semi-statically grants a periodic resource for a periodic transmission of the encoder output. In some other cases, the uplink grant dynamically grants a resource for a transmission of the encoder output.

The priority component 1145 may transmit, to the UE, a configuration message indicating a priority rule for transmission of the encoder output, where the encoder output is received on a resource based on the priority rule.

The handover component 1150 may initiate a handover of the UE to a second base station different from the base station (e.g., a first base station) based on the set of measurements.

The load redistribution component 1155 may perform a load redistribution across a set of base stations or a set of RATs or both for a set of UEs including the UE based on the set of measurements.

Figure 12:
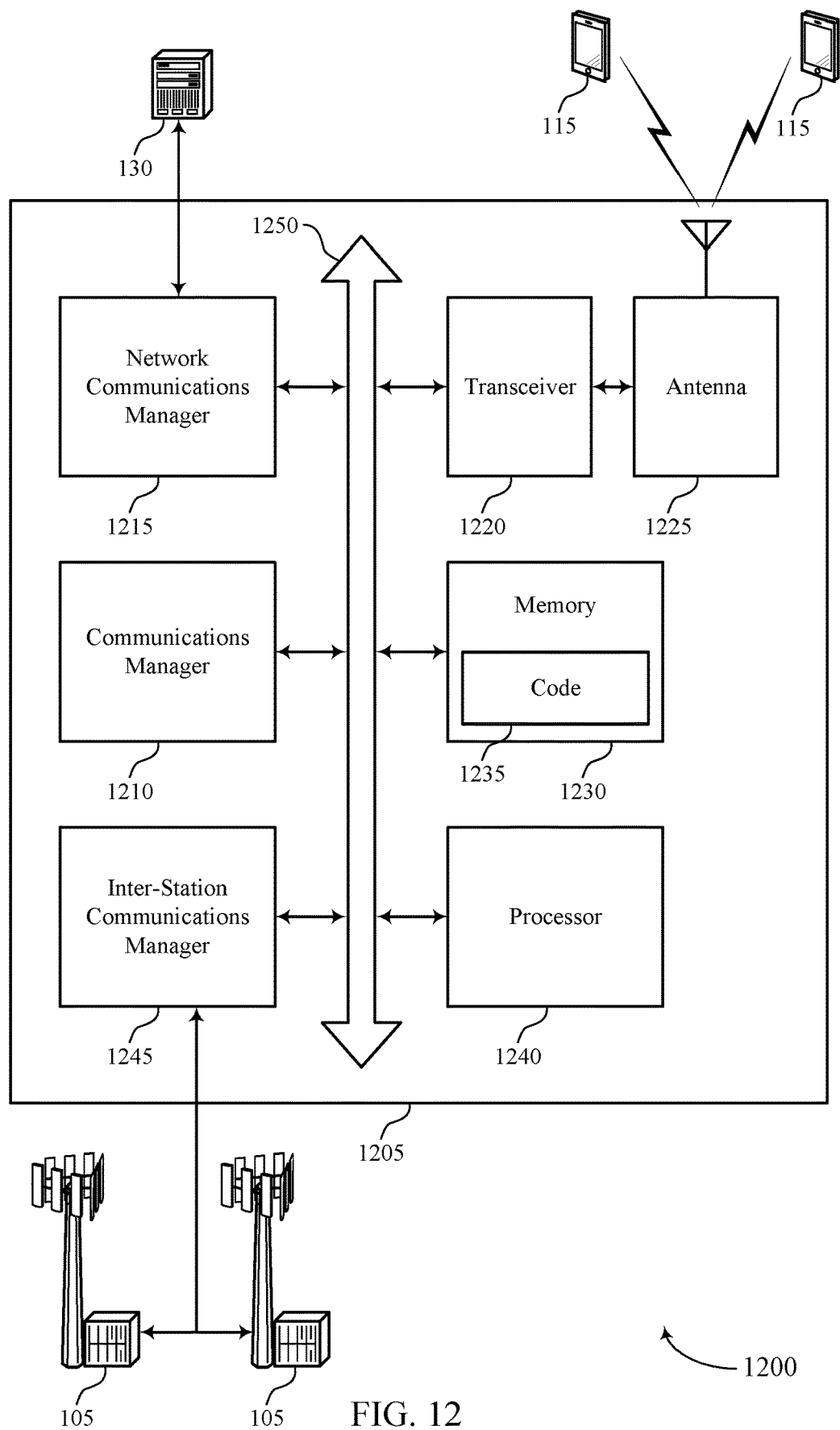
FIG. 12 shows a diagram of a system including a device that supports compressed measurement feedback using an encoder NN, in accordance with one or more aspects of the present disclosure.

FIG. 12 shows a diagram of a system 1200 including a device 1205 that supports compressed measurement feedback using an encoder NN, in accordance with one or more aspects of the present disclosure. The device 1205 may be an example of or include the components of device 905, device 1005, or a base station 105 as described herein. The device 1205 may include components for bi-directional voice and data communications including components for transmitting and receiving communications, including a communications manager 1210, a network communications manager 1215, a transceiver 1220, an antenna 1225, memory 1230, a processor 1240, and an inter-station communications manager 1245. These components may be in electronic communication via one or more buses (e.g., bus 1250).

The communications manager 1210 may receive, from a UE, an encoder output including a first number of bits, decompress the encoder output using a decoder NN to obtain a set of measurements, the set of measurements corresponding to a second number of bits for reporting the set of measurements that is greater than the first number of bits, and communicate with the UE based on the set of measurements.

The network communications manager 1215 may manage communications with the core network 130 (e.g., via one or more wired backhaul links). For example, the network communications manager 1215 may manage the transfer of data communications for client devices, such as one or more UEs 115.

The transceiver 1220 may communicate bi-directionally, via one or more antennas, wired, or wireless links as described above. For example, the transceiver 1220 may represent a wireless transceiver and may communicate bi-directionally with another wireless transceiver. The transceiver 1220 may also include a modem to modulate the packets and provide the modulated packets to the antennas for transmission, and to demodulate packets received from the antennas.

In some cases, the wireless device may include a single antenna 1225. However, in some cases the device may have more than one antenna 1225, which may be capable of concurrently transmitting or receiving multiple wireless transmissions.

The memory 1230 may include RAM, ROM, or a combination thereof. The memory 1230 may store computer-readable code 1235 including instructions that, when executed by a processor (e.g., the processor 1240) cause the device to perform various functions described herein. In some cases, the memory 1230 may contain, among other things, a BIOS which may control basic hardware or software operation such as the interaction with peripheral components or devices.

The processor 1240 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1240 may be configured to operate a memory array using a memory controller. In some cases, a memory controller may be integrated into processor 1240. The processor 1240 may be configured to execute computer-readable instructions stored in a memory (e.g., the memory 1230) to cause the device 1205 to perform various functions (e.g., functions or tasks supporting compressed measurement feedback using an encoder NN).

The inter-station communications manager 1245 may manage communications with other base station 105, and may include a controller or scheduler for controlling communications with UEs 115 in cooperation with other base stations 105. For example, the inter-station communications manager 1245 may coordinate scheduling for transmissions to UEs 115 for various interference mitigation techniques such as beamforming or joint transmission. In some examples, the inter-station communications manager 1245 may provide an X2 interface within an LTE/LTE-A wireless communication network technology to provide communication between base stations 105.

The code 1235 may include instructions to implement aspects of the present disclosure, including instructions to support wireless communications. The code 1235 may be stored in a non-transitory computer-readable medium such as system memory or other type of memory. In some cases, the code 1235 may not be directly executable by the processor 1240 but may cause a computer (e.g., when compiled and executed) to perform functions described herein.

Figure 13:
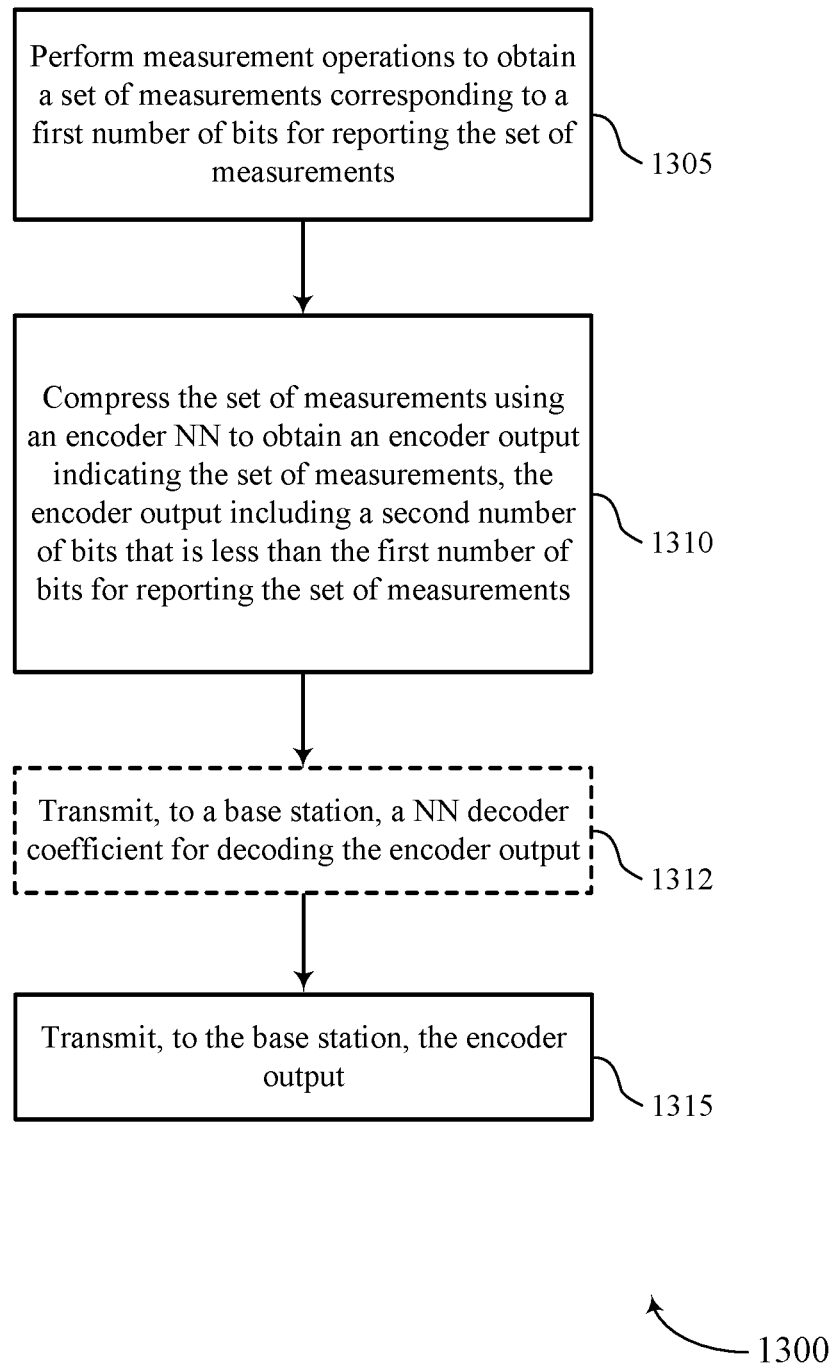
FIGS. 13 through 17 show flowcharts illustrating methods that support compressed measurement feedback using an encoder NN, in accordance with one or more aspects of the present disclosure.

FIG. 13 shows a flowchart illustrating a method 1300 that supports compressed measurement feedback using an encoder NN, in accordance with one or more aspects of the present disclosure. The operations of method 1300 may be implemented by a UE 115 or its components as described herein. For example, the operations of method 1300 may be performed by a communications manager as described with reference to FIGS. 5 through 8. In some examples, a UE may execute a set of instructions to control the functional elements of the UE to perform the functions described below. Additionally or alternatively, a UE may perform aspects of the functions described below using special-purpose hardware.

At 1305, the UE may perform measurement operations to obtain a set of measurements corresponding to a first number of bits for reporting the set of measurements. The operations of 1305 may be performed according to the methods described herein. In some examples, aspects of the operations of 1305 may be performed by a measurement component as described with reference to FIGS. 5 through 8.

At 1310, the UE may compress the set of measurements using an encoder NN to obtain an encoder output indicating the set of measurements, the encoder output including a second number of bits that is less than the first number of bits for reporting the set of measurements. The operations of 1310 may be performed according to the methods described herein. In some examples, aspects of the operations of 1310 may be performed by an encoder NN as described with reference to FIGS. 5 through 8.

At 1312, the UE may transmit, to a base station, a set of NN decoder coefficients for decoding the encoder output. The operations of 1312 may be performed according to the methods described herein. In some examples, aspects of the operations of 1312 may be performed by a reporting component as described with reference to FIGS. 5 through 8.

At 1315, the UE may transmit, to the base station, the encoder output. The operations of 1315 may be performed according to the methods described herein. In some examples, aspects of the operations of 1315 may be performed by a reporting component as described with reference to FIGS. 5 through 8.

Figure 14:
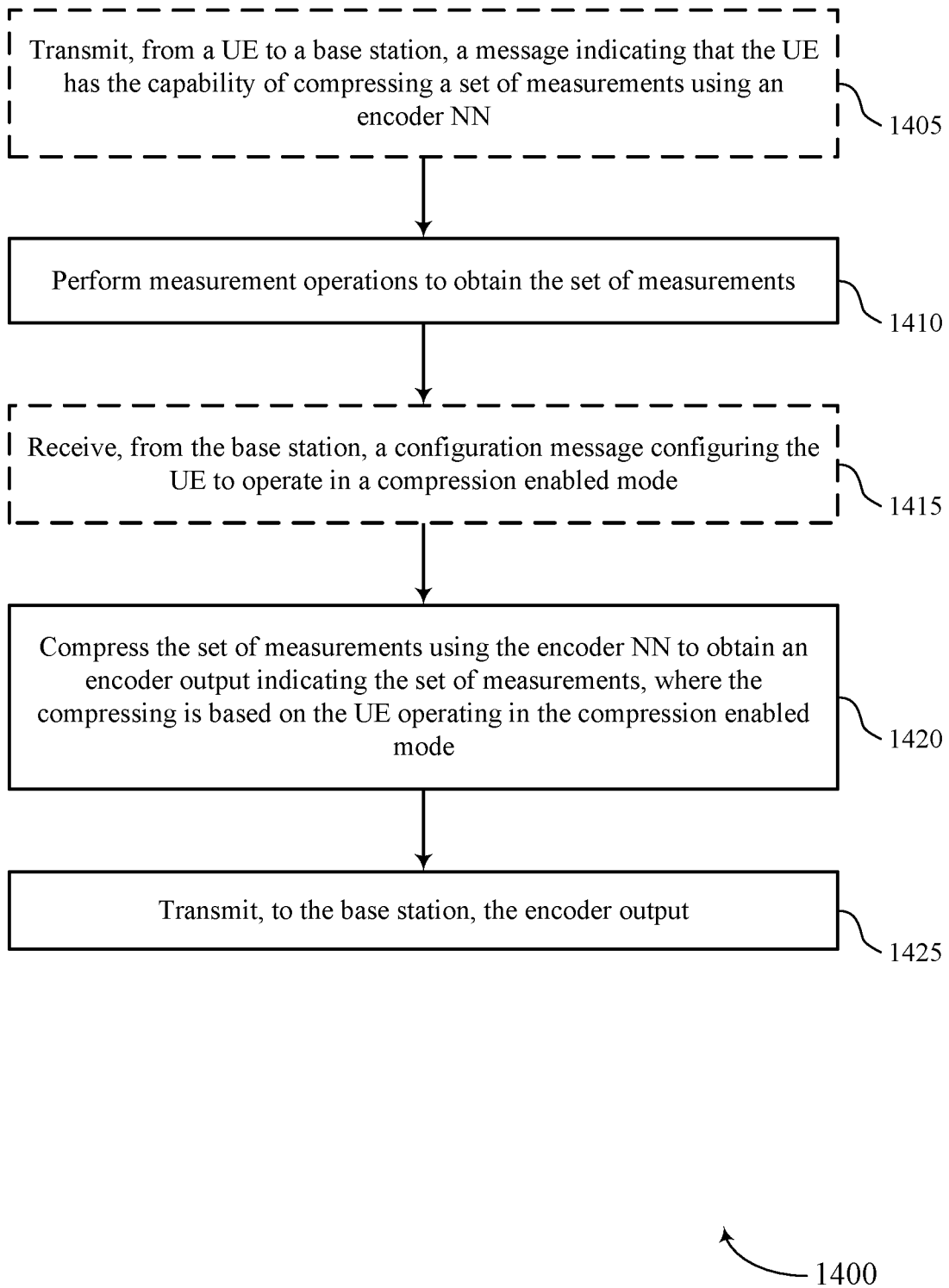

FIG. 14 shows a flowchart illustrating a method 1400 that supports compressed measurement feedback using an encoder NN, in accordance with one or more aspects of the present disclosure. The operations of method 1400 may be implemented by a UE 115 or its components as described herein. For example, the operations of method 1400 may be performed by a communications manager as described with reference to FIGS. 5 through 8. In some examples, a UE may execute a set of instructions to control the functional elements of the UE to perform the functions described below. Additionally or alternatively, a UE may perform aspects of the functions described below using special-purpose hardware.

At 1405, the UE may transmit, to a base station, a message indicating that the UE has the capability of compressing a set of measurements using an encoder NN. The operations of 1405 may be performed according to the methods described herein. In some examples, aspects of the operations of 1405 may be performed by a capability component as described with reference to FIGS. 5 through 8.

At 1410, the UE may perform measurement operations to obtain the set of measurements corresponding to a first number of bits for reporting the set of measurements. The operations of 1410 may be performed according to the methods described herein. In some examples, aspects of the operations of 1410 may be performed by a measurement component as described with reference to FIGS. 5 through 8.

At 1415, the UE may receive, from the base station, a configuration message configuring the UE to operate in a compression enabled mode. The operations of 1415 may be performed according to the methods described herein. In some examples, aspects of the operations of 1415 may be performed by a configuration component as described with reference to FIGS. 5 through 8.

At 1420, the UE may compress the set of measurements using the encoder NN to obtain an encoder output indicating the set of measurements, the encoder output including a second number of bits that is less than the first number of bits for reporting the set of measurements. Compressing the set of measurements using the encoder NN may be based on the UE operating in the compression enabled mode. The operations of 1420 may be performed according to the methods described herein. In some examples, aspects of the operations of 1420 may be performed by an encoder NN as described with reference to FIGS. 5 through 8.

At 1425, the UE may transmit, to a base station, the encoder output. The operations of 1425 may be performed according to the methods described herein. In some examples, aspects of the operations of 1425 may be performed by a reporting component as described with reference to FIGS. 5 through 8.

Figure 15:
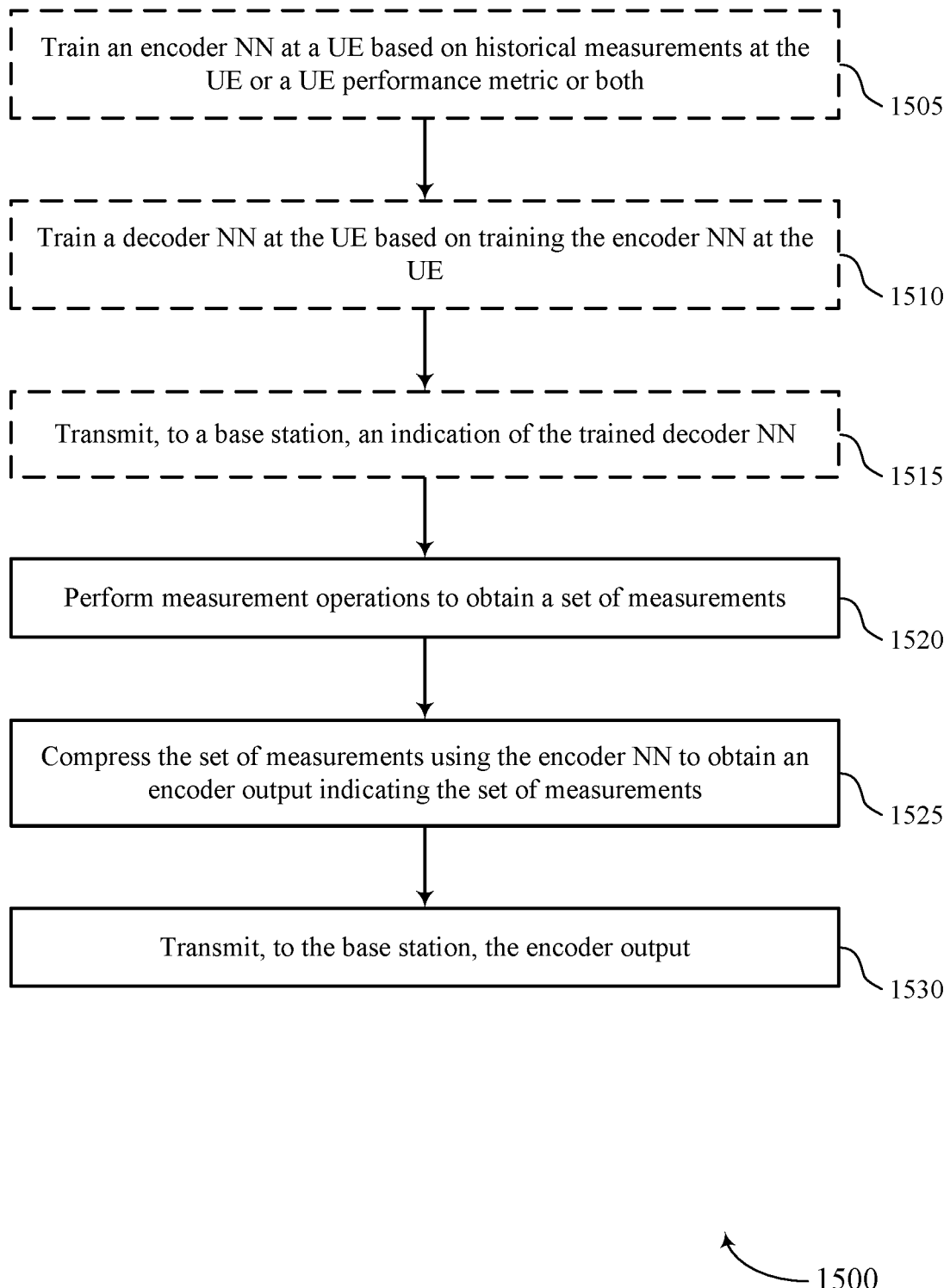

FIG. 15 shows a flowchart illustrating a method 1500 that supports compressed measurement feedback using an encoder NN, in accordance with one or more aspects of the present disclosure. The operations of method 1500 may be implemented by a UE 115 or its components as described herein. For example, the operations of method 1500 may be performed by a communications manager as described with reference to FIGS. 5 through 8. In some examples, a UE may execute a set of instructions to control the functional elements of the UE to perform the functions described below. Additionally or alternatively, a UE may perform aspects of the functions described below using special-purpose hardware.

At 1505, the UE may train an encoder NN at the UE based on historical measurements at the UE or a UE performance metric or both. The operations of 1505 may be performed according to the methods described herein. In some examples, aspects of the operations of 1505 may be performed by an encoder NN as described with reference to FIGS. 5 through 8.

At 1510, the UE may train a decoder NN at the UE based on the training the encoder NN at the UE. The operations of 1510 may be performed according to the methods described herein. In some examples, aspects of the operations of 1510 may be performed by a decoder NN as described with reference to FIGS. 5 through 8.

At 1515, the UE may transmit, to a base station, an indication of the trained decoder NN. The operations of 1515 may be performed according to the methods described herein. In some examples, aspects of the operations of 1515 may be performed by a decoder NN as described with reference to FIGS. 5 through 8.

At 1520, the UE may perform measurement operations to obtain a set of measurements corresponding to a first number of bits for reporting the set of measurements. The operations of 1520 may be performed according to the methods described herein. In some examples, aspects of the operations of 1520 may be performed by a measurement component as described with reference to FIGS. 5 through 8.

At 1525, the UE may compress the set of measurements using the encoder NN to obtain an encoder output indicating the set of measurements, the encoder output including a second number of bits that is less than the first number of bits for reporting the set of measurements. The operations of 1525 may be performed according to the methods described herein. In some examples, aspects of the operations of 1525 may be performed by an encoder NN as described with reference to FIGS. 5 through 8.

At 1530, the UE may transmit, to a base station, the encoder output. The operations of 1530 may be performed according to the methods described herein. In some examples, aspects of the operations of 1530 may be performed by a reporting component as described with reference to FIGS. 5 through 8.

Figure 16:
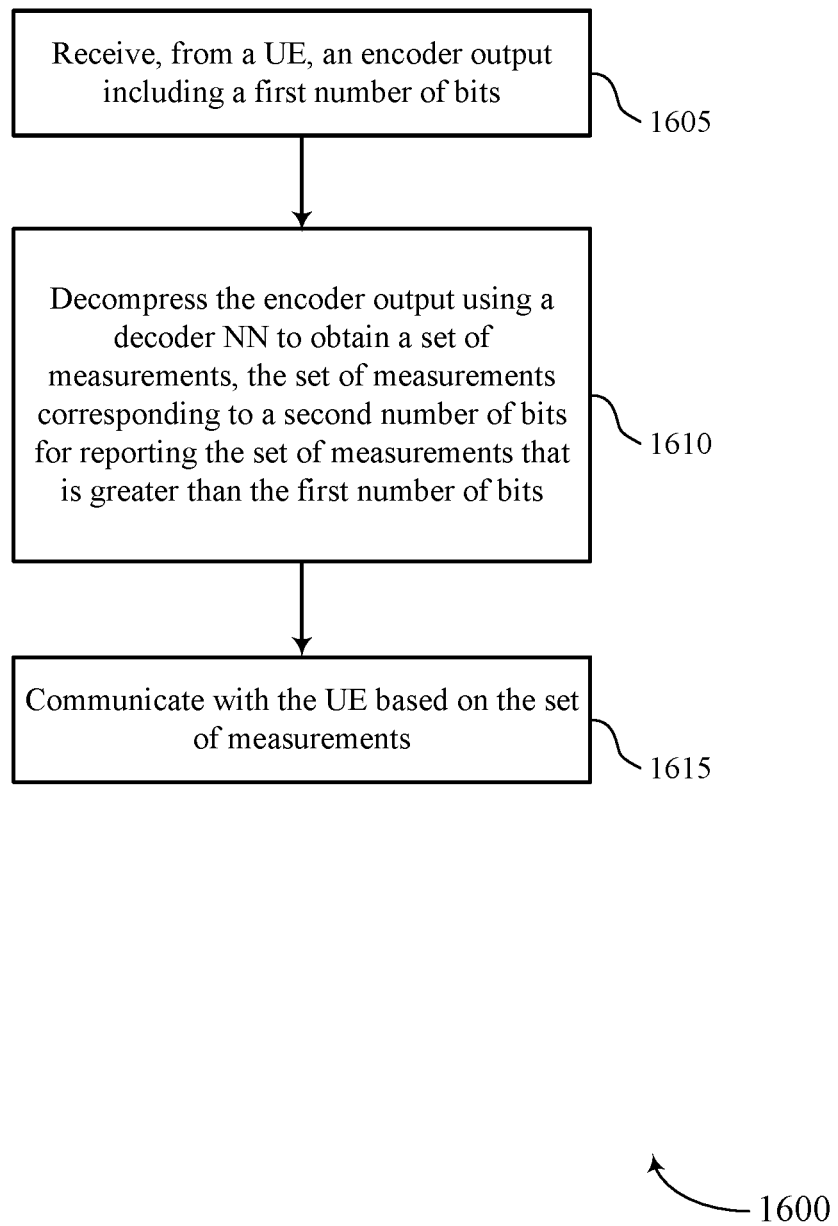

FIG. 16 shows a flowchart illustrating a method 1600 that supports compressed measurement feedback using an encoder NN, in accordance with one or more aspects of the present disclosure. The operations of method 1600 may be implemented by a base station 105 or its components as described herein. For example, the operations of method 1600 may be performed by a communications manager as described with reference to FIGS. 9 through 12. In some examples, a base station may execute a set of instructions to control the functional elements of the base station to perform the functions described below. Additionally or alternatively, a base station may perform aspects of the functions described below using special-purpose hardware.

At 1605, the base station may receive, from a UE, an encoder output including a first number of bits. The operations of 1605 may be performed according to the methods described herein. In some examples, aspects of the operations of 1605 may be performed by an encoder output component as described with reference to FIGS. 9 through 12.

At 1610, the base station may decompress the encoder output using a decoder NN to obtain a set of measurements, the set of measurements corresponding to a second number of bits for reporting the set of measurements that is greater than the first number of bits. The operations of 1610 may be performed according to the methods described herein. In some examples, aspects of the operations of 1610 may be performed by a decoder NN as described with reference to FIGS. 9 through 12.

At 1615, the base station may communicate with the UE based on the set of measurements. The operations of 1615 may be performed according to the methods described herein. In some examples, aspects of the operations of 1615 may be performed by a communication component as described with reference to FIGS. 9 through 12.

Figure 17:
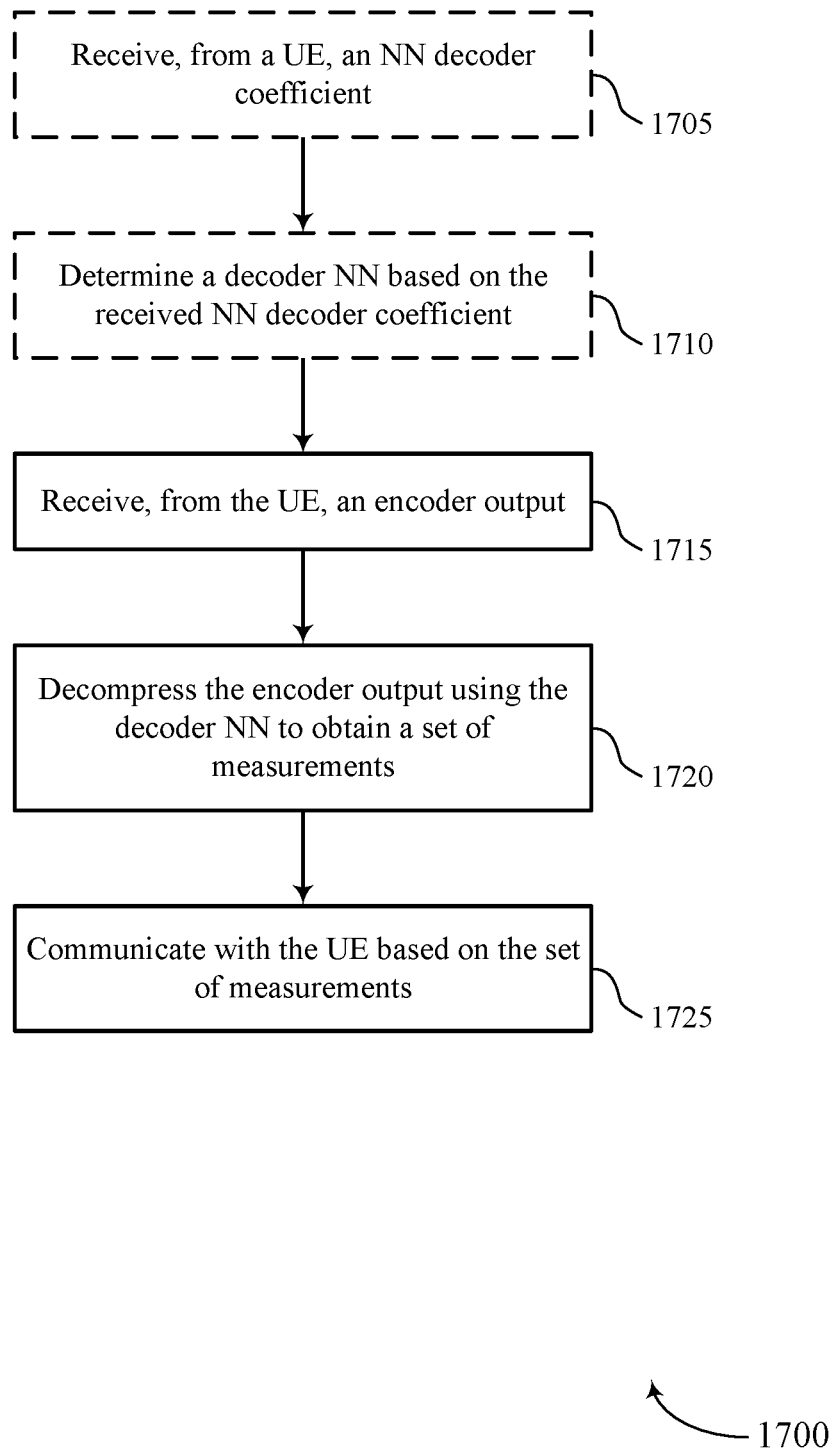

FIG. 17 shows a flowchart illustrating a method 1700 that supports compressed measurement feedback using an encoder NN, in accordance with one or more aspects of the present disclosure. The operations of method 1700 may be implemented by a base station 105 or its components as described herein. For example, the operations of method 1700 may be performed by a communications manager as described with reference to FIGS. 9 through 12. In some examples, a base station may execute a set of instructions to control the functional elements of the base station to perform the functions described below. Additionally or alternatively, a base station may perform aspects of the functions described below using special-purpose hardware.

At 1705, the base station may receive, from a UE, a set of NN decoder coefficients. The operations of 1705 may be performed according to the methods described herein. In some examples, aspects of the operations of 1705 may be performed by a decoder NN as described with reference to FIGS. 9 through 12.

At 1710, the base station may determine a decoder NN based on the received NN decoder coefficients. The operations of 1710 may be performed according to the methods described herein. In some examples, aspects of the operations of 1710 may be performed by a decoder NN as described with reference to FIGS. 9 through 12.

At 1715, the base station may receive, from the UE, an encoder output including a first number of bits. The operations of 1715 may be performed according to the methods described herein. In some examples, aspects of the operations of 1715 may be performed by an encoder output component as described with reference to FIGS. 9 through 12.

At 1720, the base station may decompress the encoder output using the decoder NN to obtain a set of measurements, the set of measurements corresponding to a second number of bits for reporting the set of measurements that is greater than the first number of bits. The operations of 1720 may be performed according to the methods described herein. In some examples, aspects of the operations of 1720 may be performed by a decoder NN as described with reference to FIGS. 9 through 12.

At 1725, the base station may communicate with the UE based on the set of measurements. The operations of 1725 may be performed according to the methods described herein. In some examples, aspects of the operations of 1725 may be performed by a communication component as described with reference to FIGS. 9 through 12.

It should be noted that the methods described herein describe possible implementations, and that the operations may be rearranged or otherwise modified and that other implementations are possible. Further, aspects from two or more of the methods may be combined.

The following examples are given by way of illustration. Aspects of the following examples may be combined with aspects shown or discussed in relation to the figures or elsewhere herein.

Aspect 1: A method for wireless communications at a UE, comprising: performing measurement operations to obtain a plurality of measurements corresponding to a first number of bits for reporting the plurality of measurements; compressing the plurality of measurements using an encoder neural network to obtain an encoder output indicating the plurality of measurements, the encoder output comprising a second number of bits that is less than the first number of bits for reporting the plurality of measurements; and transmitting, to a base station, the encoder output.

Aspect 2: The method of aspect 1, further comprising: transmitting, to the base station, a message indicating that the UE has the capability of compressing the plurality of measurements using the encoder neural network.

Aspect 3: The method of aspect 2, further comprising: performing a radio resource control setup procedure comprising the transmission of the message.

Aspect 4: The method of any of aspects 1 to 3, further comprising: receiving, from the base station, a configuration message configuring the UE to operate in a compression enabled mode, wherein the compressing the plurality of measurements using the encoder neural network is based at least in part on the UE operating in the compression enabled mode.

Aspect 5: The method of any of aspects 1 to 4, further comprising: receiving, from the base station, an indication of the plurality of measurements, wherein the compressing the plurality of measurements using the encoder neural network further comprises: inputting the plurality of measurements into the encoder neural network based at least in part on the indication of the plurality of measurements.

Aspect 6: The method of any of aspects 1 to 5, further comprising: receiving, from the base station, an uplink grant for the encoder output, wherein the encoder output is transmitted based at least in part on the uplink grant.

Aspect 7: The method of aspect 6, wherein the uplink grant semi-statically grants a periodic resource for a periodic transmission of the encoder output.

Aspect 8: The method of aspect 6, wherein the uplink grant dynamically grants a resource for a transmission of the encoder output.

Aspect 9: The method of any of aspects 1 to 8, further comprising: transmitting, to the base station, a set of neural network decoder coefficients for decoding the encoder output.

Aspect 10: The method of aspect 9, further comprising: receiving, from the base station, a configuration message indicating a periodicity for neural network decoder coefficient feedback, wherein the set of neural network decoder coefficients is periodically transmitted to the base station based at least in part on the periodicity for neural network decoder coefficient feedback.

Aspect 11: The method of any of aspects 1 to 10, further comprising: receiving, from the base station, a configuration message indicating a priority rule for the transmitting the encoder output; and determining to transmit the encoder output on a resource based at least in part on the priority rule.

Aspect 12: The method of aspect 11, wherein the resource comprises an updated resource, the method further comprising: determining to transmit the encoder output on an initial resource; determining that a message scheduled for communication at least partially overlaps with the initial resource; and preempting transmission of the encoder output based at least in part on the message having a higher priority than the encoder output according to the priority rule, wherein the encoder output is transmitted on the updated resource based at least in part on the preempting.

Aspect 13: The method of aspect 11, further comprising: determining that a message scheduled for communication at least partially overlaps with the resource; and preempting communication of the message based at least in part on the message having a lower priority than the encoder output according to the priority rule, wherein the encoder output is transmitted on the resource based at least in part on the preempting.

Aspect 14: The method of any of aspects 1 to 13, wherein the base station comprises a first base station, the method further comprising: performing a handover procedure from the first base station to a second base station different from the first base station based at least in part on the transmitting the encoder output.

Aspect 15: The method of any of aspects 1 to 14, further comprising: training the encoder neural network at the UE based at least in part on historical measurements at the UE or a UE performance metric or both.

Aspect 16: The method of aspect 15, further comprising: training a decoder neural network at the UE based at least in part on the training the encoder neural network at the UE; and transmitting, to the base station, an indication of the trained decoder neural network.

Aspect 17: The method of aspect 16, wherein the UE comprises an auto-encoder comprising the encoder neural network and the decoder neural network.

Aspect 18: The method of any of aspects 1 to 17, wherein the encoder output comprises a feature indicating at least two measurements of the plurality of measurements or a statistic associated with the plurality of measurements or both.

Aspect 19: The method of any of aspects 1 to 18, wherein the plurality of measurements corresponds to a plurality of base stations, a plurality of sensors at the UE, a plurality of radio access technologies, or a combination thereof.

Aspect 20: The method of any of aspects 1 to 19, wherein the plurality of measurements comprises a reference signal received power measurement, a reference signal received quality measurement, a received signal strength indicator, a reference signal time difference, a global navigation satellite system measurement, a round-trip time measurement, a sensor output, or a combination thereof.

Aspect 21: A method for wireless communications at a base station, comprising: receiving, from a UE, an encoder output comprising a first number of bits; decompressing the encoder output using a decoder neural network to obtain a plurality of measurements, the plurality of measurements corresponding to a second number of bits for reporting the plurality of measurements that is greater than the first number of bits; and communicating with the UE based at least in part on the plurality of measurements.

Aspect 22: The method of aspect 21, further comprising: receiving, from the UE, a message indicating that the UE has the capability of compressing the plurality of measurements using an encoder neural network, wherein the decompressing the encoder output using the decoder neural network is based at least in part on the message.

Aspect 23: The method of aspect 22, further comprising: performing a radio resource control setup procedure with the UE comprising the reception of the message.

Aspect 24: The method of any of aspects 21 to 23, further comprising: transmitting, to the UE, a configuration message configuring the UE to operate in a compression enabled mode, wherein the encoder output is received based at least in part on the UE operating in the compression enabled mode.

Aspect 25: The method of any of aspects 21 to 24, further comprising: transmitting, to the UE, an indication of the plurality of measurements for compression, wherein the encoder output indicates the plurality of measurements based at least in part on the indication of the plurality of measurements for compression.

Aspect 26: The method of any of aspects 21 to 25, further comprising: transmitting, to the UE, an uplink grant for the encoder output, wherein the encoder output is received based at least in part on the uplink grant.

Aspect 27: The method of aspect 26, wherein the uplink grant semi-statically grants a periodic resource for a periodic transmission of the encoder output.

Aspect 28: The method of aspect 26, wherein the uplink grant dynamically grants a resource for a transmission of the encoder output.

Aspect 29: The method of any of aspects 21 to 28, further comprising: receiving, from the UE, a set of neural network decoder coefficients; and determining the decoder neural network based at least in part on the received set of neural network decoder coefficients.

Aspect 30: The method of aspect 29, further comprising: transmitting, to the UE, a configuration message indicating a periodicity for neural network decoder coefficient feedback, wherein the set of neural network decoder coefficients is periodically received from the UE based at least in part on the periodicity for neural network decoder coefficient feedback.

Aspect 31: The method of any of aspects 21 to 30, further comprising: transmitting, to the UE, a configuration message indicating a priority rule for transmission of the encoder output, wherein the encoder output is received on a resource based at least in part on the priority rule.

Aspect 32: The method of any of aspects 21 to 31, wherein the base station comprises a first base station and the communicating comprises: initiating a handover of the UE to a second base station different from the first base station based at least in part on the plurality of measurements.

Aspect 33: The method of any of aspects 21 to 32, wherein the communicating comprises: performing a load redistribution across a plurality of base stations or a plurality of radio access technologies or both for a plurality of UEs comprising the UE based at least in part on the plurality of measurements.

Aspect 34: The method of any of aspects 21 to 33, wherein the encoder output comprises a feature indicating at least two measurements of the plurality of measurements or a statistic associated with the plurality of measurements or both.

Aspect 35: The method of any of aspects 21 to 34, wherein the plurality of measurements corresponds to a plurality of base stations, a plurality of sensors at the UE, a plurality of radio access technologies, or a combination thereof.

Aspect 36: The method of any of aspects 21 to 35, wherein the plurality of measurements comprises a reference signal received power measurement, a reference signal received quality measurement, a received signal strength indicator, a reference signal time difference, a global navigation satellite system measurement, a round-trip time measurement, a sensor output, or a combination thereof.

Aspect 37: An apparatus for wireless communications comprising a processor; and memory coupled to the processor, the processor and memory configured to perform a method of any of aspects 1 to 20.

Aspect 38: An apparatus for wireless communications comprising a processor; and memory coupled to the processor, the processor and memory configured to perform a method of any of aspects 21 to 36.

Aspect 39: An apparatus comprising at least one means for performing a method of any of aspects 1 to 20.

Aspect 40: An apparatus comprising at least one means for performing a method of any of aspects 21 to 36.

Aspect 41: A non-transitory computer-readable medium storing code for wireless communications, the code comprising instructions executable by a processor to perform a method of any of aspects 1 to 20.

Aspect 42: A non-transitory computer-readable medium storing code for wireless communications, the code comprising instructions executable by a processor to perform a method of any of aspects 21 to 36.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that may be accessed by a general-purpose or special purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example process that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communications at a user equipment (UE), comprising:
   performing measurement operations to obtain a plurality of measurements corresponding to a first number of bits for reporting the plurality of measurements;
   compressing the plurality of measurements using an encoder neural network to obtain an encoder output indicating the plurality of measurements, the encoder output comprising a second number of bits that is less than the first number of bits for reporting the plurality of measurements;
   transmitting, to a base station, a set of neural network decoder coefficients for decoding the encoder output; and
   transmitting, to the base station, the encoder output.

2. The method of claim 1, further comprising:
   receiving, from the base station, a configuration message indicating a periodicity for neural network decoder coefficient feedback, wherein the set of neural network decoder coefficients is periodically transmitted to the base station based at least in part on the periodicity for neural network decoder coefficient feedback.

3. The method of claim 1, further comprising:
   receiving, from the base station, a configuration message indicating a priority rule for the transmitting the encoder output; and
   determining to transmit the encoder output on a resource based at least in part on the priority rule.

4. The method of claim 3, wherein the resource comprises an updated resource, the method further comprising:
   determining to transmit the encoder output on an initial resource;
   determining that a message scheduled for communication at least partially overlaps with the initial resource; and
   preempting transmission of the encoder output based at least in part on the message having a higher priority than the encoder output according to the priority rule, wherein the encoder output is transmitted on the updated resource based at least in part on the preempting.

5. The method of claim 3, further comprising:
   determining that a message scheduled for communication at least partially overlaps with the resource; and
   preempting communication of the message based at least in part on the message having a lower priority than the encoder output according to the priority rule, wherein the encoder output is transmitted on the resource based at least in part on the preempting.

6. The method of claim 1, wherein the encoder output comprises a feature indicating at least two measurements of the plurality of measurements or a statistic associated with the plurality of measurements or both.

7. The method of claim 1, wherein the plurality of measurements corresponds to a plurality of base stations, a plurality of sensors at the UE, a plurality of radio access technologies, or a combination thereof.

8. The method of claim 1, wherein the plurality of measurements comprises a reference signal received power measurement, a reference signal received quality measurement, a received signal strength indicator, a reference signal time difference, a global navigation satellite system measurement, a round-trip time measurement, a sensor output, or a combination thereof.

9. The method of claim 1, further comprising:
transmitting, to the base station, a message indicating that the UE has the capability of compressing the plurality of measurements using the encoder neural network.

10. The method of claim 9, further comprising:
performing a radio resource control setup procedure comprising the transmission of the message.

11. The method of claim 1, further comprising:
receiving, from the base station, a configuration message configuring the UE to operate in a compression enabled mode, wherein the compressing the plurality of measurements using the encoder neural network is based at least in part on the UE operating in the compression enabled mode.

12. The method of claim 1, further comprising:
receiving, from the base station, an indication of the plurality of measurements, wherein the compressing the plurality of measurements using the encoder neural network further comprises:
inputting the plurality of measurements into the encoder neural network based at least in part on the indication of the plurality of measurements.

13. The method of claim 1, further comprising:
receiving, from the base station, an uplink grant for the encoder output, wherein the encoder output is transmitted based at least in part on the uplink grant.

14. The method of claim 13, wherein the uplink grant semi-statically grants a periodic resource for a periodic transmission of the encoder output.

15. The method of claim 13, wherein the uplink grant dynamically grants a resource for a transmission of the encoder output.

16. The method of claim 1, wherein the base station comprises a first base station, the method further comprising:
performing a handover procedure from the first base station to a second base station different from the first base station based at least in part on the transmitting the encoder output.

17. The method of claim 1, further comprising:
training the encoder neural network at the UE based at least in part on historical measurements at the UE or a UE performance metric or both.

18. The method of claim 17, further comprising:
training a decoder neural network at the UE based at least in part on the training the encoder neural network at the UE; and
transmitting, to the base station, an indication of the trained decoder neural network.

19. The method of claim 18, wherein the UE comprises an auto-encoder comprising the encoder neural network and the decoder neural network.

20. A method for wireless communications at a base station, comprising:
receiving, from a user equipment (UE), a set of neural network decoder coefficients;
determining a decoder neural network based at least in part on the received set of neural network decoder coefficients;
receiving, from the UE, an encoder output comprising a first number of bits;
decompressing the encoder output using the decoder neural network to obtain a plurality of measurements, the plurality of measurements corresponding to a second number of bits for reporting the plurality of measurements that is greater than the first number of bits; and
communicating with the UE based at least in part on the plurality of measurements.

21. The method of claim 20, further comprising:
transmitting, to the UE, a configuration message indicating a periodicity for neural network decoder coefficient feedback, wherein the neural network decoder coefficient is periodically received from the UE based at least in part on the periodicity for neural network decoder coefficient feedback.

22. The method of claim 20, further comprising:
transmitting, to the UE, a configuration message indicating a priority rule for transmission of the encoder output, wherein the encoder output is received on a resource based at least in part on the priority rule.

23. The method of claim 20, wherein the encoder output comprises a feature indicating at least two measurements of the plurality of measurements or a statistic associated with the plurality of measurements or both.

24. The method of claim 20, wherein the plurality of measurements corresponds to a plurality of base stations, a plurality of sensors at the UE, a plurality of radio access technologies, or a combination thereof.

25. The method of claim 20, wherein the plurality of measurements comprises a reference signal received power measurement, a reference signal received quality measurement, a received signal strength indicator, a reference signal time difference, a global navigation satellite system measurement, a round-trip time measurement, a sensor output, or a combination thereof.

26. The method of claim 20, further comprising:
receiving, from the UE, a message indicating that the UE has the capability of compressing the plurality of measurements using an encoder neural network, wherein the decompressing the encoder output using the decoder neural network is based at least in part on the message.

27. The method of claim 26, further comprising:
performing a radio resource control setup procedure with the UE comprising the reception of the message.

28. The method of claim 20, further comprising:
transmitting, to the UE, a configuration message configuring the UE to operate in a compression enabled mode, wherein the encoder output is received based at least in part on the UE operating in the compression enabled mode.

29. The method of claim 20, further comprising:
transmitting, to the UE, an indication of the plurality of measurements for compression, wherein the encoder output indicates the plurality of measurements based at least in part on the indication of the plurality of measurements for compression.

30. The method of claim 20, further comprising:
transmitting, to the UE, an uplink grant for the encoder output, wherein the encoder output is received based at least in part on the uplink grant.

31. The method of claim 30, wherein the uplink grant semi-statically grants a periodic resource for a periodic transmission of the encoder output.

32. The method of claim 30, wherein the uplink grant dynamically grants a resource for a transmission of the encoder output.

33. The method of claim 20, wherein the base station comprises a first base station and the communicating comprises:
    initiating a handover of the UE to a second base station different from the first base station based at least in part on the plurality of measurements.

34. The method of claim 20, wherein the communicating comprises:
    performing a load redistribution across a plurality of base stations or a plurality of radio access technologies or both for a plurality of UEs comprising the UE based at least in part on the plurality of measurements.

35. An apparatus for wireless communications at a user equipment (UE), comprising:
    a processor; and
    memory coupled to the processor, the processor and memory configured to:
        perform measurement operations to obtain a plurality of measurements corresponding to a first number of bits for reporting the plurality of measurements;
        compress the plurality of measurements using an encoder neural network to obtain an encoder output indicating the plurality of measurements, the encoder output comprising a second number of bits that is less than the first number of bits for reporting the plurality of measurements;
        transmit, to a base station, a set of neural network decoder coefficients for decoding the encoder output; and
        transmit, to the base station, the encoder output.

36. The apparatus of claim 35, further comprising:
    an antenna array, wherein the processor and memory are further configured to:
        receive, from the base station, a configuration message indicating a periodicity for neural network decoder coefficient feedback, wherein the set of neural network decoder coefficients is periodically transmitted to the base station based at least in part on the periodicity for neural network decoder coefficient feedback.

37. The apparatus of claim 35, wherein the processor and memory are further configured to:
    receive, from the base station, a configuration message indicating a priority rule for the transmitting the encoder output; and
    determine to transmit the encoder output on a resource based at least in part on the priority rule.

38. The apparatus of claim 35, wherein the encoder output comprises a feature indicating at least two measurements of the plurality of measurements or a statistic associated with the plurality of measurements or both.

39. The apparatus of claim 35, wherein the plurality of measurements corresponds to a plurality of base stations, a plurality of sensors at the UE, a plurality of radio access technologies, or a combination thereof.

40. An apparatus for wireless communications at a base station, comprising:
    a processor; and
    memory coupled to the processor, the processor and memory configured to:
        receive, from a user equipment (UE), an encoder output comprising a first number of bits;
        receive, from the UE, a set of neural network decoder coefficients;
        determine a decoder neural network based at least in part on the received set of neural network decoder coefficients;
        decompress the encoder output using the decoder neural network to obtain a plurality of measurements, the plurality of measurements corresponding to a second number of bits for reporting the plurality of measurements that is greater than the first number of bits; and
        communicate with the UE based at least in part on the plurality of measurements.

41. The apparatus of claim 40, further comprising:
    an antenna array, wherein the processor and memory are further configured to:
        transmit, to the UE, a configuration message indicating a periodicity for neural network decoder coefficient feedback, wherein the set of neural network decoder coefficients is periodically received from the UE based at least in part on the periodicity for neural network decoder coefficient feedback.

42. The apparatus of claim 40, wherein the processor and memory are further configured to:
    transmit, to the UE, a configuration message indicating a priority rule for transmission of the encoder output, wherein the encoder output is received on a resource based at least in part on the priority rule.

43. The apparatus of claim 40, wherein the encoder output comprises a feature indicating at least two measurements of the plurality of measurements or a statistic associated with the plurality of measurements or both.

44. The apparatus of claim 40, wherein the plurality of measurements corresponds to a plurality of base stations, a plurality of sensors at the UE, a plurality of radio access technologies, or a combination thereof.

* * * * *